US012328909B2

(12) United States Patent
Kang et al.

(10) Patent No.: US 12,328,909 B2
(45) Date of Patent: Jun. 10, 2025

(54) SEMICONDUCTOR DEVICES AND METHODS OF FABRICATING THE SAME

(71) Applicant: Samsung Electronics Co., Ltd., Suwon-si (KR)

(72) Inventors: MyungGil Kang, Suwon-si (KR); Dongwon Kim, Seongnam-si (KR); KeunHwi Cho, Seoul (KR); Daewon Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 431 days.

(21) Appl. No.: 17/720,741

(22) Filed: Apr. 14, 2022

(65) Prior Publication Data

US 2023/0049858 A1    Feb. 16, 2023

(30) Foreign Application Priority Data

Aug. 10, 2021  (KR) ................. 10-2021-0105272

(51) Int. Cl.
| | |
|---|---|
| *H10D 30/67* | (2025.01) |
| *H01L 21/02* | (2006.01) |
| *H10D 30/01* | (2025.01) |
| *H10D 62/10* | (2025.01) |
| *H10D 64/01* | (2025.01) |

(52) U.S. Cl.
CPC ..... *H10D 30/6757* (2025.01); *H01L 21/0259* (2013.01); *H10D 30/031* (2025.01); *H10D 30/6713* (2025.01); *H10D 30/6735* (2025.01); *H10D 62/118* (2025.01); *H10D 64/017* (2025.01); *H10D 64/018* (2025.01)

(58) Field of Classification Search
CPC ......... H01L 29/42392; H01L 29/66553; H01L 29/78696
See application file for complete search history.

(56) References Cited

U.S. PATENT DOCUMENTS

| | | | |
|---|---|---|---|
| 10,128,379 B2 | 11/2018 | Song et al. | |
| 10,872,825 B2 | 12/2020 | Chiang et al. | |
| 2008/0268588 A1* | 10/2008 | Anderson | H01L 29/665 257/E27.114 |
| 2018/0083007 A1* | 3/2018 | Lee | H01L 27/092 |
| 2020/0020689 A1 | 1/2020 | Ohtou et al. | |
| 2020/0027992 A1* | 1/2020 | Jung | H01L 29/78696 |
| 2020/0035705 A1* | 1/2020 | Kim | H01L 21/823481 |

(Continued)

*Primary Examiner* — Walter H Swanson
*Assistant Examiner* — Jacob T Nelson
(74) *Attorney, Agent, or Firm* — Myers Bigel, P.A.

(57) ABSTRACT

A semiconductor device may include: an active pattern on a substrate and extending in a first direction; a plurality of source/drain patterns on the active pattern and spaced apart from each other in the first direction; a gate electrode between the plurality of source/drain patterns that crosses the active pattern and extends in a second direction intersecting the first direction; and a plurality of channel patterns stacked on the active pattern and configured to connect two or more of the source/drain patterns to each other. The channel patterns may be spaced apart from each other. Each of the channel patterns may include a first portion between the gate electrode and the source/drain patterns, and a plurality of second portions connected to the first portion and overlapped with the gate electrode in a direction perpendicular to a plane defined by an upper surface of the substrate.

20 Claims, 27 Drawing Sheets

(56) References Cited

U.S. PATENT DOCUMENTS

| | | |
|---|---|---|
| 2020/0066725 A1 | 2/2020 | Bhuwalka et al. |
| 2020/0343342 A1 | 10/2020 | Xie et al. |
| 2020/0395470 A1 | 12/2020 | Kim et al. |
| 2021/0104524 A1* | 4/2021 | Hwang ............. H01L 29/42392 |
| 2021/0367036 A1* | 11/2021 | Kim .................. H01L 29/42392 |

* cited by examiner

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. § 119 to Korean Patent Application No. 10-2021-0105272, filed on Aug. 10, 2021, in the Korean Intellectual Property Office, the entire contents of which are hereby incorporated by reference.

BACKGROUND OF THE INVENTION

The present disclosure relates to semiconductor devices, and in particular, semiconductor devices including field effect transistors and methods of fabricating the same. A semiconductor device may include an integrated circuit comprising metal-oxide-semiconductor field-effect transistors (MOSFETs). To meet an increasing demand for a semiconductor device with a small pattern size and a reduced design rule, the MOSFETs are being aggressively scaled down. The scale-down of the MOSFETs may lead to deterioration in operational properties of the semiconductor device. Accordingly, a variety of studies are being conducted to overcome technical limitations associated with the scale-down of the semiconductor device and to realize high performance semiconductor devices.

SUMMARY

One embodiment of the present disclosure provides a semiconductor device with improved electrical characteristics and reliability and a method of fabricating the same.

According to one embodiment of the present disclosure, a semiconductor device may comprise: an active pattern on a substrate and extending in a first direction; a plurality of source/drain patterns on the active pattern and spaced apart from each other in the first direction; a gate electrode between the source/drain patterns that crosses the active pattern and extends in a second direction intersecting the first direction; and a plurality of channel patterns stacked on the active pattern and configured to connect two or more of the plurality of source/drain patterns to each other. The plurality of channel patterns may be spaced apart from each other, such as in a direction perpendicular to a plane defined by an upper surface of the substrate. Each of the plurality of channel patterns may include a first portion between the gate electrode and the plurality of source/drain patterns, and a plurality of second portions connected to the first portion and overlapped with the gate electrode in a direction perpendicular to a plane defined by an upper surface of the substrate. Each of the plurality of second portions may be spaced apart from each other in the second direction.

According to another embodiment of the present disclosure, a semiconductor device may comprise: an active pattern on a substrate that extends in a first direction; a plurality of source/drain patterns on the active pattern and spaced apart from each other in the first direction; a gate electrode between the source/drain patterns that crosses the active pattern and extends in a second direction intersecting the first direction; a plurality of channel patterns stacked on the active pattern and configured to connect two or more of the plurality of source/drain patterns to each other; a gate insulating pattern between the gate electrode and the plurality of channel patterns; a plurality of gate spacers extending from a top surface of an uppermost one of the plurality of channel patterns to be on at least a portion of a side surface of the gate electrode; a gate capping pattern between the gate spacers and on a top surface of the gate electrode; an interlayer insulating layer on a top surface of one or more of the plurality of source/drain patterns, a side surface of one or more of the plurality of gate spacers, and a top surface of the gate capping pattern; a plurality of active contacts penetrating the interlayer insulating layer and connected to respective ones of the plurality of source/drain patterns; and a gate contact penetrating the gate capping pattern and the interlayer insulating layer and connected to the gate electrode. The plurality of channel patterns may be spaced apart from each other, such as in a direction perpendicular to a plane defined by an upper surface of the substrate. Each of the plurality of channel patterns may include a first portion between the gate electrode and the plurality of source/drain patterns and a plurality of second portions connected to the first portion and overlapped with the gate electrode in a direction perpendicular to a plane defined by an upper surface of the substrate. The plurality of second portions may be spaced apart from each other in the second direction.

According to another embodiment of the present disclosure, a semiconductor device may comprise: a substrate comprising a first cell region and a second cell region; a plurality of active patterns on each of the first and second cell regions of the substrate and extending in a first direction; a first plurality of source/drain patterns on the first cell region and spaced apart from each other in the first direction; a gate electrode between the first plurality of source/drain patterns that crosses at least one of the plurality of active patterns and extends in a second direction intersecting the first direction; and a first plurality of channel patterns stacked on the first cell region and configured to connect two or more of the first plurality of source/drain patterns to each other. The first plurality of channel patterns may be spaced apart from each other, such as in a direction in a direction perpendicular to a plane defined by an upper surface of the substrate. Each of the first plurality of channel patterns may include a first portion between the gate electrode and the first plurality of source/drain patterns and a plurality of second portions connected to the first portion and overlapped with the gate electrode in a direction perpendicular to a plane defined by an upper surface of the substrate. The plurality of second portions may be spaced apart from each other in the second direction.

DETAILED DESCRIPTION

Example embodiments of the present disclosure will now be described more fully with reference to the accompanying drawings, in which example embodiments are shown.

Figure 1A:
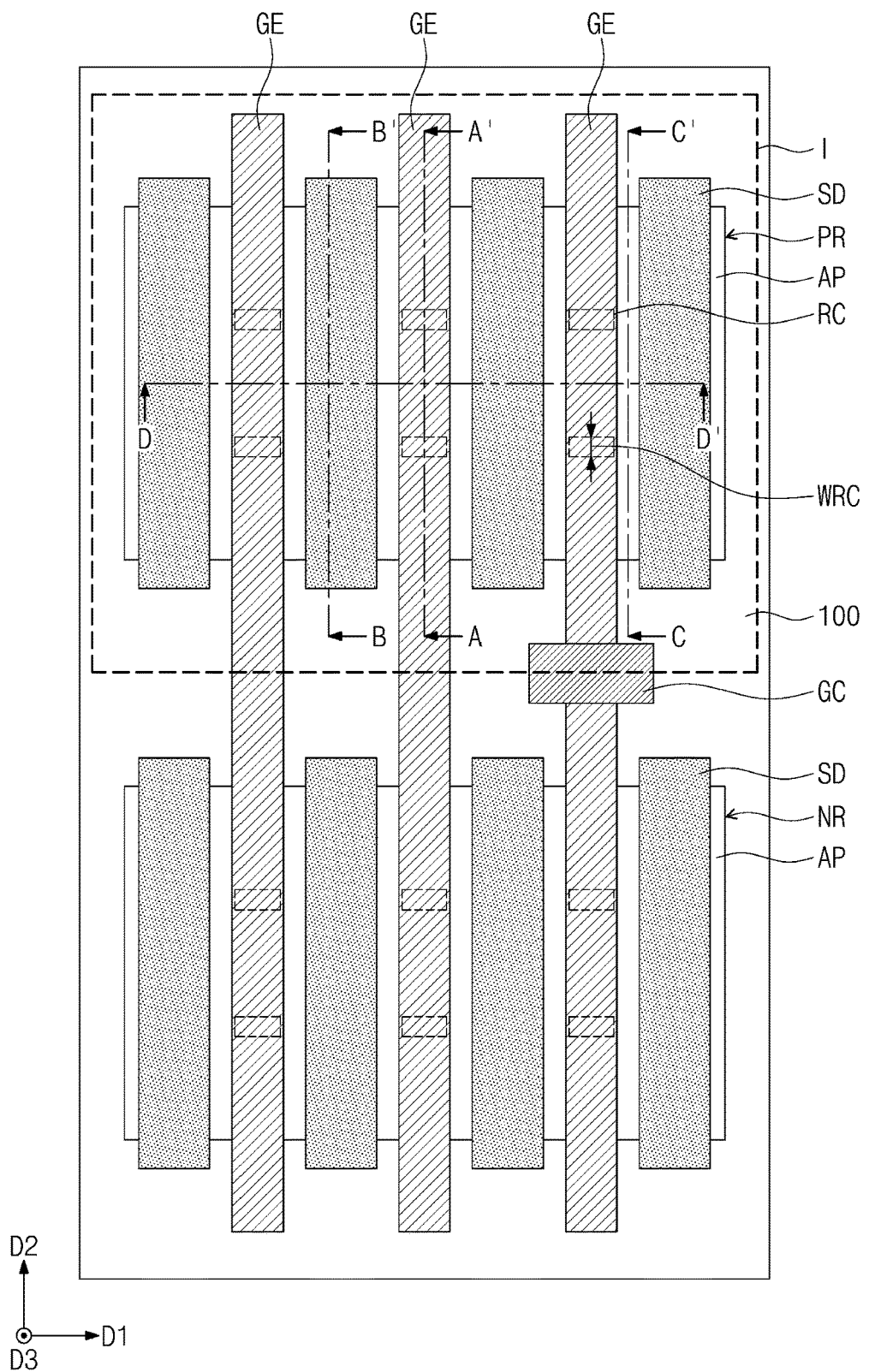
FIG. 1A is a plan view illustrating a semiconductor device according to an embodiment of the present disclosure.
Figure 1B:
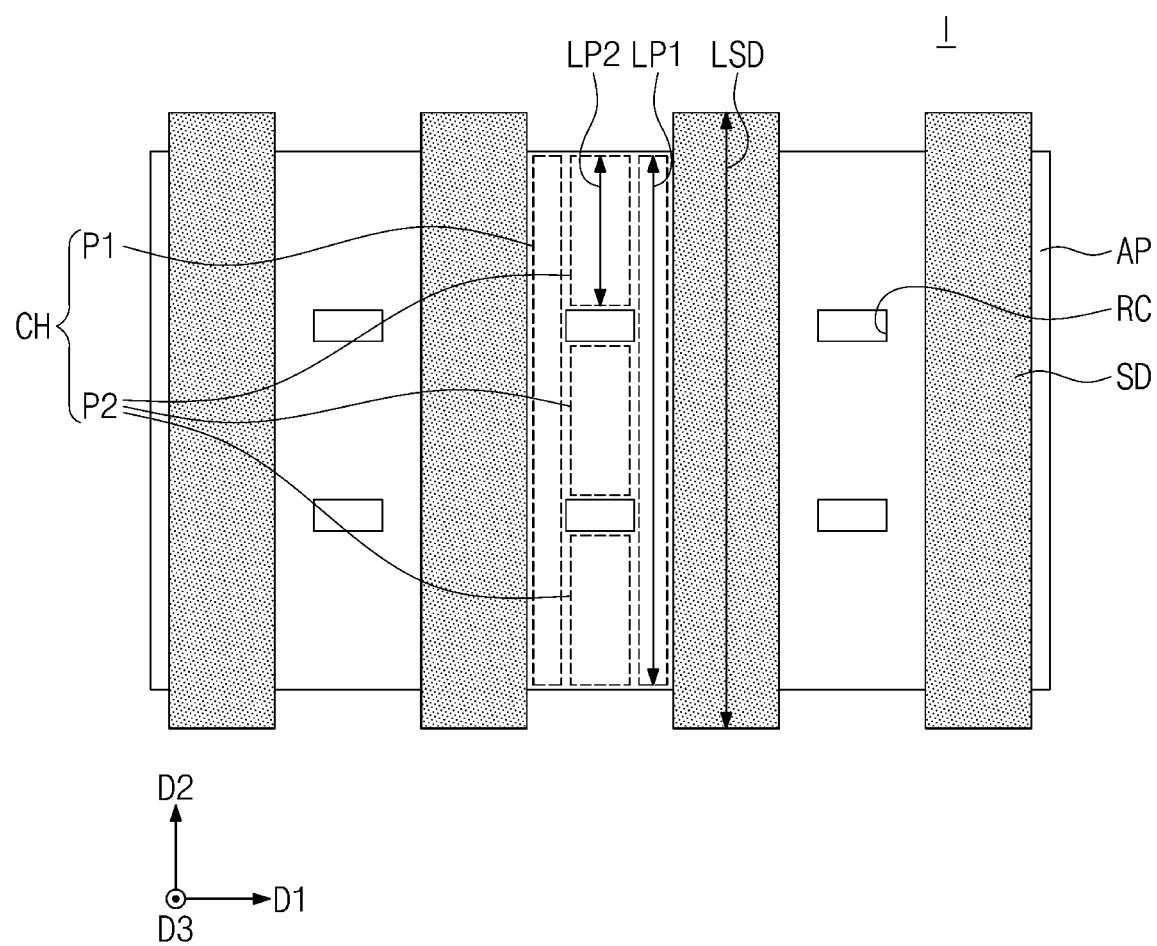
FIG. 1B is a plan view illustrating one of a plurality of channel patterns of a semiconductor device according to an embodiment of the present disclosure and corresponding to a portion 'I' of FIG. 1A.

FIG. 1A is a plan view illustrating a semiconductor device according to an embodiment of the present disclosure. FIG. 1B is a plan view illustrating one of channel patterns of a semiconductor device according to an embodiment of the present disclosure and corresponding to a portion 'I' of FIG. 1A. FIGS. 2A, 2B, 2C, and 2D are sectional views, which are respectively taken along lines A-A', B-B', C-C', and D-D' of FIG. 1A, to illustrate a semiconductor device according to an embodiment of the present disclosure.

Referring to FIGS. 1A, 1B, 2A, 2B, 2C, and 2D, a substrate 100 including at least one active pattern AP may be provided. The substrate 100 may be a semiconductor substrate which is formed of or includes at least one of, for example, silicon (Si), germanium (Ge), silicon germanium (SiGe), or compound semiconductor materials. In one embodiment, the substrate 100 may be a silicon wafer. A top surface of the substrate 100 may be parallel to a first direction D1 and a second direction D2 and may be perpendicular to a third direction D3. The first direction D1, the second direction D2, and the third direction D3 may be orthogonal to each other.

The active pattern AP may include a plurality of active patterns AP which extend in the first direction D1 and are spaced apart from each other in the second direction D2. One of the active patterns AP may be provided on a first cell region PR, and another of the active patterns AP may be provided on a second cell region NR. The first and second cell regions PR and NR may be regions in which a standard cell constituting a logic circuit is provided. The transistors provided on the first and second cell regions PR and NR may be logic transistors. As an example, the first cell region PR may be a region in which PMOS field effect transistors are provided, and the second cell region NR may be a region in which NMOS field effect transistors are provided. The description that follows will refer to an example in which a single active pattern AP is provided on the first cell region PR, for convenience in description, but the remaining active patterns AP may be configured to have substantially the same features as those described below.

A top surface of the active pattern AP may have at least one recessed portion RC. That is, a portion of the top surface of the active pattern AP may be recessed toward a bottom surface of the substrate 100. In one embodiment, a width WRC of the recessed portion RC in the second direction D2 may range from about five (5) nanometers (nm) to about forty (40) nm. As an example, the width WRC of the recessed portion RC in the second direction D2 may range from about 10 nm to 30 nm. A width of the recessed portion RC in the first direction D1 may be substantially equal to a width of a gate electrode GE in the first direction D1. The width of the recessed portion RC in the first direction D1 may be defined as the largest width of the recessed portion RC in the first direction D1 or an upper width of the recessed portion RC in the first direction D1. The width WRC of the recessed portion RC in the second direction D2 may be defined as the largest width of the recessed portion RC in the second direction D2 or an upper width of the recessed portion RC in the second direction D2.

Figure 2A:
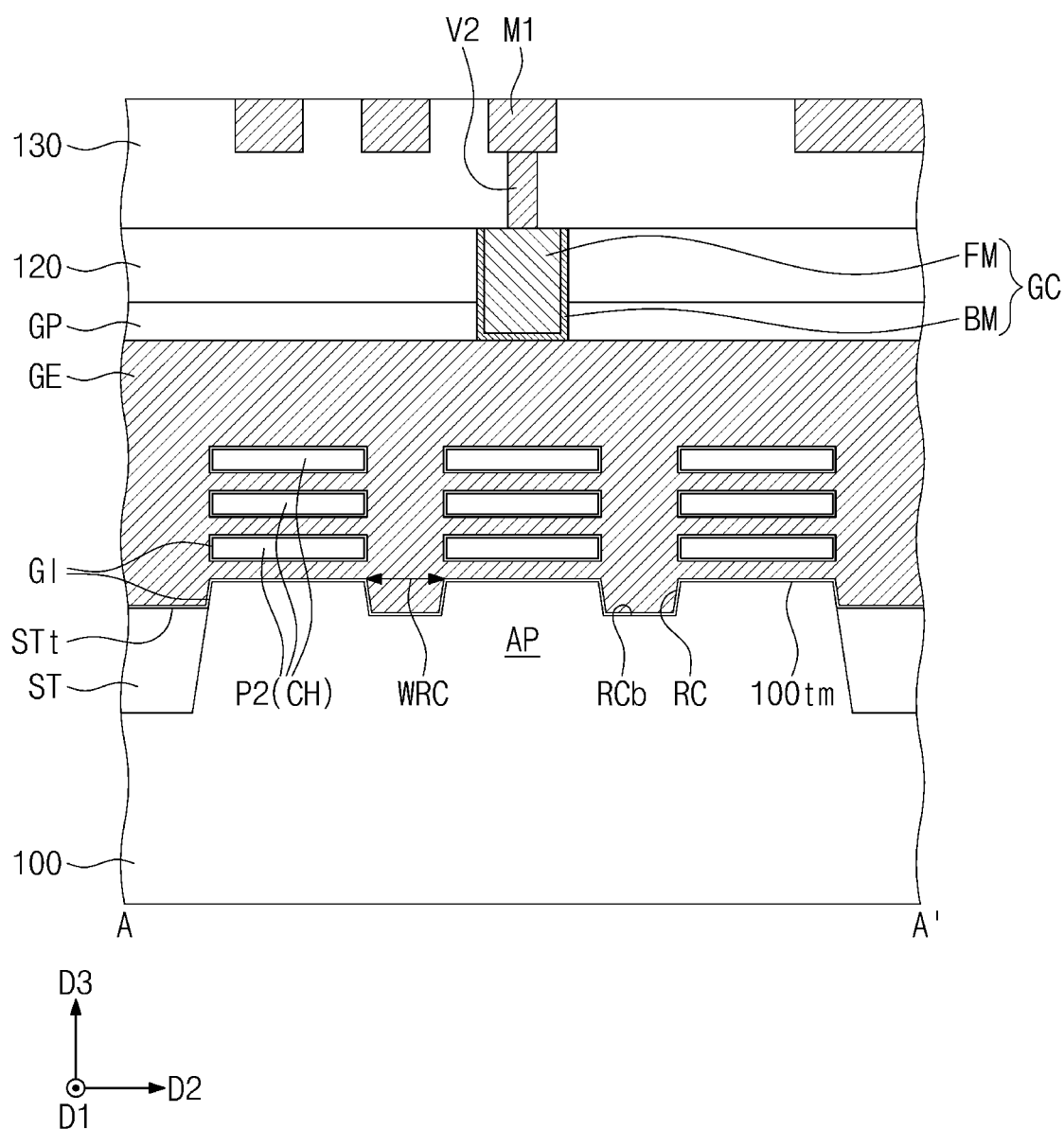
FIGS. 2A, 2B, 2C, and 2D are sectional views, which are respectively taken along lines A-A', B-B', C-C', and D-D' of FIG. 1A to illustrate a semiconductor device according to an embodiment of the present disclosure.

Referring to FIG. 2A, a bottom surface RCb of the recessed portion RC may be located at a level lower than a topmost surface 100tm of the substrate 100 where an upper layer of the substrate may serve as a base reference layer, but the present disclosure is not limited to this example. The topmost surface 100tm of the substrate 100 may correspond to the topmost surface of the active pattern AP. In one embodiment, the bottom surface RCb of the recessed portion RC may be located at a level lower than a top surface STt of a device isolation layer ST where an upper layer of the substrate may serve as a base reference layer, but the present disclosure is not limited to this example. In one embodiment, the bottom surface RCb of the recessed portion RC may be located at a level which is lower than the topmost surface 100tm of the substrate 100 and higher than the top surface STt of the device isolation layer ST, where an upper level of the substrate may serve as a base reference layer.

The device isolation layer ST may be provided on the substrate 100 to define the active pattern AP. The device isolation layer ST may be on, and at least partially cover, at least a portion of side surfaces of the active pattern AP and may expose at least a portion of the top surface of the active pattern AP. The device isolation layer ST may be formed of or include at least one of, for example, silicon oxide, silicon nitride, or silicon oxynitride. The active pattern AP may correspond to an upper portion of the substrate 100 enclosed by the device isolation layer ST.

A plurality of source/drain patterns SD may be on the active pattern AP of the substrate 100 and may extend in the second direction D2. The plurality of source/drain patterns SD may be spaced apart from each other in the first direction D1. Each of the plurality of source/drain patterns SD may be in contact with one or more pf a plurality of channel patterns CH. The plurality of source/drain patterns SD which are provided on the first cell region PR will be referred to as a 'first plurality of source/drain patterns', and the source/drain patterns SD which are provided on the second cell region NR will be referred to as a 'second plurality of source/drain patterns'.

The plurality of source/drain patterns SD may be epitaxial patterns, which are formed using the substrate 100 and the channel patterns CH as a seed layer. The plurality of source/drain patterns SD may be formed of or include at least one of doped semiconductor materials. The plurality of source/drain patterns SD may be formed of or include at least one of, for example, silicon (Si), silicon germanium (SiGe), or silicon carbide (SiC). The plurality of source/drain patterns SD may be configured to exert a tensile strain or compressive strain on the channel patterns CH.

Figure 2B:
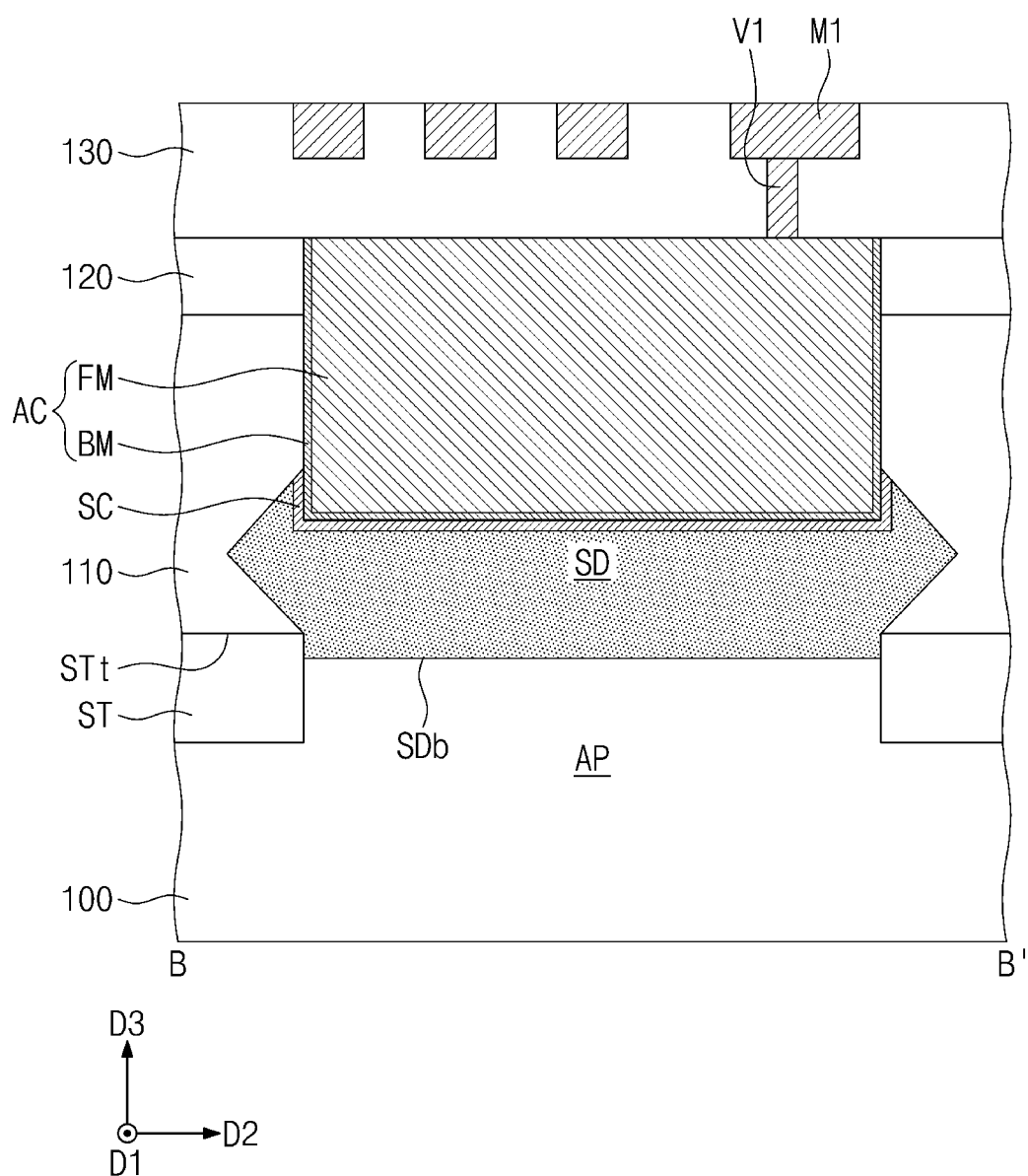
Figure 2C:
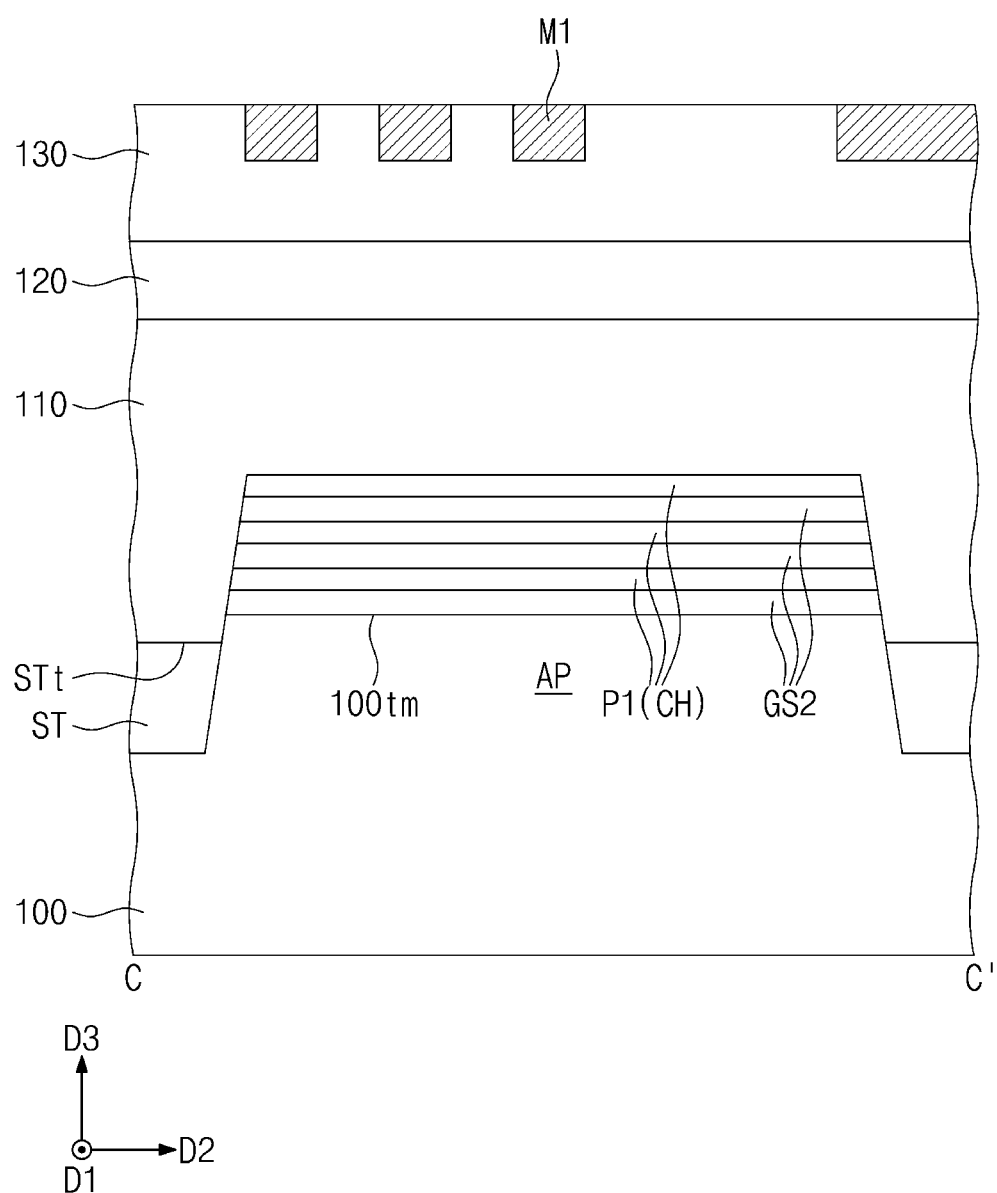
Figure 2D:
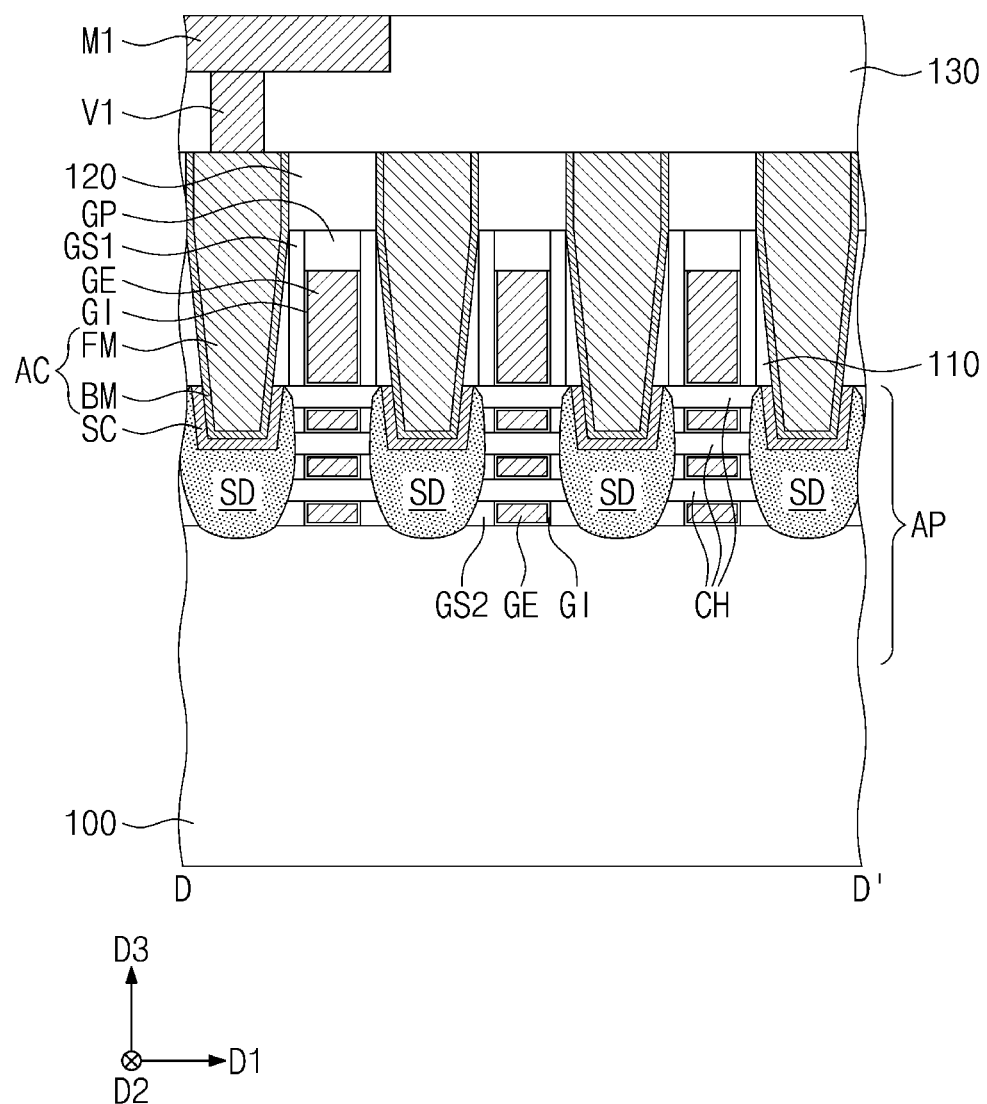

Referring to FIGS. 2B and 2D, at least a portion of the plurality of source/drain patterns SD may be buried in the active pattern AP. A bottom surface SDb of each of the plurality of source/drain patterns SD may be located at a level lower than the top surface STt of the device isolation layer ST, where an upper level of the substrate may serve as a base reference layer. The bottom surface SDb of each of the plurality of source/drain patterns SD may be in contact with at least a portion of the top surface of the active pattern AP, and in one embodiment, an entirety of the bottom surface SDb of each of the plurality of source/drain patterns SD may be in contact with an entirety of the top surface of the active pattern AP. One or more of the plurality of source/drain patterns SD may have side surfaces which are located on the top surface STt of the device isolation layer ST, each of which extends from a corresponding one of the side surfaces of the active pattern AP in the second direction D2.

The gate electrodes GE may extend in the second direction D2 to cross the active pattern AP of the substrate 100. Each of the gate electrodes GE may be between a corresponding pair of the plurality of source/drain patterns SD. Each of the gate electrodes GE may be spaced apart from each of the plurality of source/drain patterns SD in the first direction D1. The description that follows will refer to an example in which a pair of the source/drain patterns SD and one gate electrode GE therebetween are provided, for convenience in description, but the remaining gate electrodes GE and the remaining source/drain patterns SD may be configured to have substantially the same features as those in the example to be described below.

The gate electrode GE may be on, and at least partially cover, the top surface STt of the device isolation layer ST, a top surface of the active pattern AP, and top and bottom surfaces of the channel patterns CH. The gate electrode GE may be formed of or include at least one of, for example, doped semiconductor materials, conductive metal nitrides, and/or metallic materials. More specifically, the gate electrode GE may include a plurality of different metal patterns. The metal patterns may have electric resistances different from each other. By adjusting a thickness and composition of each of the metal patterns, it may be possible to realize a transistor having a desired threshold voltage.

The plurality of channel patterns CH may be on the active pattern AP of the substrate 100. The plurality of channel patterns CH may be stacked in the third direction D3 perpendicular to the top surface of the substrate 100, and in one embodiment, the plurality of channel patterns CH may be sequentially stacked. Each of the plurality of channel patterns CH may extend in the first direction D1 and may be configured to connect two or more of the plurality of source/drain patterns SD to each other. The plurality of channel patterns CH may be spaced apart from each other in the third direction D3. The gate electrode GE (or second gate spacers GS2 to be described below) may be interposed between two or more of the plurality of channel patterns CH, which are spaced apart from each other in the third direction D3. More specifically, the second gate spacers GS2 may be interposed between two or more of the plurality of channel patterns CH, which correspond to a first portion P1 to be described below, and the gate electrode GE may be interposed between two or more of the plurality of channel patterns CH, which correspond to a plurality of second portions P2 to be described below. Ones of the plurality of channel patterns CH which are provided on the first cell region PR will be referred to as a 'first plurality of channel patterns', and ones of the plurality of channel patterns CH which are provided on the second cell region NR will be referred to as a 'second plurality of channel patterns'.

In one embodiment, the gate electrode GE, the plurality of channel patterns CH, and the plurality of source/drain patterns SD may constitute a logic transistor, and the logic transistor may be a three-dimensional field effect transistor (e.g., a gate-all-around (GAA) type transistor), in which the gate electrode GE is provided to three-dimensionally surround the channel patterns CH.

Referring to FIGS. 1A and 1B, each of the plurality of channel patterns CH may include a first portion P1, which is between the gate electrode GE and the plurality of source/drain patterns SD, and a plurality of the second portions P2, which are connected to the first portion P1 and are vertically overlapped (i.e., overlapped in a direction perpendicular to a plane defined by an upper surface of the substrate) with the gate electrode GE in the third direction D3.

The first portion P1 may be in contact with one of the plurality of source/drain patterns SD. The first portion P1 may extend in the second direction D2 and may be connected to each of the plurality of second portions P2. Each of the plurality of second portions P2 may be spaced apart from the plurality of source/drain patterns SD in the first direction D1, with the first portion P1 interposed therebetween. The plurality of second portions P2 may be spaced apart from each other, in the second direction D2, with the recessed portion RC interposed therebetween, when viewed in a plan view. When viewed in the sectional view of FIG. 2A, spaces between the second portions P2 may be at least partially filled with the gate electrode GE.

In one embodiment, the recessed portion RC may include a plurality of recessed portions RC. The recessed portions RC may be spaced apart from each other, in the second direction D2, with a portion of the active pattern AP interposed therebetween. FIGS. 1A and 1B illustrate an example, in which two recessed portions RC and three second portions P2 are provided, but the number of the recessed portions RC and the number of the second portions P2 are not limited to this example.

In one embodiment, lengths LP2 of the plurality of second portions P2 in the second direction D2 may be different from each other. The length LP2 of each of the plurality of second portions P2 in the second direction D2 may be smaller than a length LP1 of the first portion P1 in the second direction D2. The length LP2 of each of the plurality of second portions P2 in the second direction D2 may be smaller than a length LSD of each of the plurality of source/drain patterns SD in the second direction D2. In one embodiment, the length LP1 of the first portion P1 in the second direction D2 may be smaller than the length LSD of each of the source/drain patterns SD in the second direction D2.

A gate insulating pattern GI may be provided between the active pattern AP and the gate electrode GE and between each of the channel patterns CH and the gate electrode GE. A plurality of first gate spacers GS1 and a plurality of second gate spacers GS2 may be provided to be on, and at least partially cover, side surfaces of the gate electrodes GE. A gate capping pattern GP may be on, and at least partially cover, the topmost surface of the gate electrode GE. A structure including the gate electrode GE, the gate insulating pattern GI, the first and second gate spacers GS1 and GS2, and the gate capping pattern GP will be referred to as a gate structure.

The gate insulating pattern GI may extend along a bottom surface of the gate electrode GE and may be interposed between the gate electrode GE and the device isolation layer ST. In other words, the gate insulating pattern GI may extend in the second direction D2 from a top surface of the active pattern AP toward a top surface of the device isolation layer ST.

Referring to FIG. 2A, the gate insulating pattern GI may be interposed between each of the channel patterns CH and the gate electrode GE. More specifically, the gate insulating pattern GI may be provided to cover or face at least a portion of top, bottom, and/or side surfaces of the plurality of second portions P2 of each of the plurality of channel patterns CH. The second portions P2 of each of the channel patterns CH may be spaced apart from the gate electrode GE with the gate insulating pattern GI interposed therebetween.

Referring to FIG. 2D, the gate insulating pattern GI may be interposed between the channel patterns CH and the gate electrode GE and between the active pattern AP and the gate electrode GE and may extend into regions between the gate electrode GE and the first gate spacers GS1 and between the gate electrode GE and the second gate spacers GS2. The topmost surface of the gate insulating pattern GI may be substantially coplanar with the topmost surface of the gate electrode GE. The gate electrode GE may be spaced apart from the first and second gate spacers GS1 and GS2 with the gate insulating pattern GI interposed therebetween.

The gate insulating pattern GI may be formed of or include at least one of, for example, silicon oxide, silicon nitride, silicon oxynitride, or high-k dielectric materials. The high-k dielectric materials may be materials (e.g., hafnium oxide (HfO), aluminum oxide (AlO), or tantalum oxide (TaO)) having higher dielectric constants than silicon oxide and silicon nitride.

Referring to FIG. 2D, the plurality of first gate spacers GS1 may extend from a top surface of the uppermost one of the channel patterns CH in the third direction D3 to cover at least a portion of the side surface of the gate electrode GE, and the plurality of second gate spacers GS2 may be between the channel patterns CH and between a lowermost one of the channel patterns CH and the active pattern AP to cover another portion of the side surface of the gate electrode GE. Each of the first and second gate spacers GS1 and GS2 may extend along the side surface of the gate electrode GE or in the second direction D2. A top surface of each of the first gate spacers GS1 may be located at a level higher than the topmost surface of the gate electrode GE and may be substantially coplanar with a top surface of the gate capping pattern GP. An adjacent pair of the first gate spacers GS1 may be spaced apart from each other, in the first direction D1, with the gate electrode GE and the gate capping pattern GP interposed therebetween. Each of the second gate spacers GS2 may be provided between each of the plurality of source/drain patterns SD and the gate electrode GE. The plurality of second gate spacers GS2 may be in contact with the source/drain patterns SD. In one embodiment, the second gate spacers GS2 may be overlapped with the first gate spacers GS1 in the third direction D3.

Referring to FIG. 2C, the plurality of second gate spacers GS2 may be provided between the channel patterns CH, which are spaced apart from each other in the third direction D3. The second gate spacers GS2 may be in contact with the first portion P1 of each of the channel patterns CH.

Each of the first and second gate spacers GS1 and GS2 and the gate capping pattern GP may be formed of or include at least one of, for example, silicon oxide, silicon nitride, or silicon oxynitride. The gate capping pattern GP may be formed of or include, for example, silicon nitride.

A first interlayer insulating layer 110 may be provided to at least partially cover the top surface STt of the device isolation layer ST, top and side surfaces of the plurality of source/drain patterns SD, side surfaces of the plurality of channel patterns CH, and side surfaces of the first plurality of gate spacers GS1. A top surface of the first interlayer insulating layer 110 may be substantially coplanar with the top surface of the gate capping pattern GP and the top surfaces of the first gate spacers GS1. A second interlayer insulating layer 120 may be on the first interlayer insulating layer 110 to cover at least a portion of the top surface of the gate capping pattern GP and the top surfaces of the first plurality of gate spacers GS1. In one embodiment, the first and second interlayer insulating layers 110 and 120 may be formed of or include silicon oxide.

Active contacts AC may be provided to penetrate the first and second interlayer insulating layers 110 and 120 and may be electrically connected to the source/drain patterns SD, respectively. A pair of the active contacts AC may be respectively provided at both sides of the gate electrode GE. When viewed in a plan view, each of the active contacts AC may be a line- or bar-shaped pattern which is extended in the second direction D2.

Each of the active contacts AC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may cover at least a portion of side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CON), or platinum nitride (PtN).

A plurality of active contacts AC may be self-aligned contacts. In other words, the active contacts AC may be formed in a self-aligned manner using the gate capping pattern GP and the first gate spacer GS1. For example, the active contacts AC may be on at least a portion of the side surfaces of the first gate spacers GS1. In one embodiment, each of the active contacts AC may cover at least a portion of the top surface of the gate capping pattern GP.

A silicide pattern SC may be provided between each of the plurality of active contacts AC and each of the source/drain patterns SD. Each of the active contacts AC may be electrically connected to a corresponding one of the source/drain patterns SD through the silicide pattern SC. The silicide pattern SC may be formed of or include at least one of metal-silicide materials. For example, the silicide pattern SC may be formed of or include at least one of titanium silicide, tantalum silicide, tungsten silicide, nickel silicide, or cobalt silicide.

A gate contact GC may penetrate the second interlayer insulating layer 120 and the gate capping pattern GP and may be electrically connected to the gate electrode GE. In one embodiment, the gate contact GC may be on the device isolation layer ST between the first and second cell regions PR and NR. When viewed in a plan view, the gate contact GC may be a line- or bar-shaped pattern extending in the first direction D1. The gate contact GC may include the conductive pattern FM and the barrier pattern BM enclosing the conductive pattern FM, similar to the active contacts AC.

A third interlayer insulating layer 130 may be on the second interlayer insulating layer 120. First interconnection lines M1, a first via V1, and a second via V2 may be provided in the third interlayer insulating layer 130. The first and second vias V1 and V2 may be below the first interconnection lines M1. The first interconnection lines M1 may extend in the first direction D1. The first interconnection lines M1 may be arranged in the first direction D1 or the second direction D2. The first via V1 may be between one of the first interconnection lines M1 and one of the active contacts AC to electrically connect them to each other. The second via V2 may be between one of the first interconnection lines M1 and the gate contact GC to electrically connect them to each other.

The first interconnection lines M1 and the first or second via V1 or V2 may be connected to each other, thereby forming a single conductive structure. For example, the first interconnection lines M1 and the first or second via V1 or V2 may be formed through the same process. The first interconnection lines M1 and the first or second via V1 or V2 may form a single conductive structure which is patterned by a dual damascene process. In one embodiment, some metal layers (e.g., M2, M3, M4, and so forth) may be additionally stacked on the third interlayer insulating layer 130.

Figure 3:
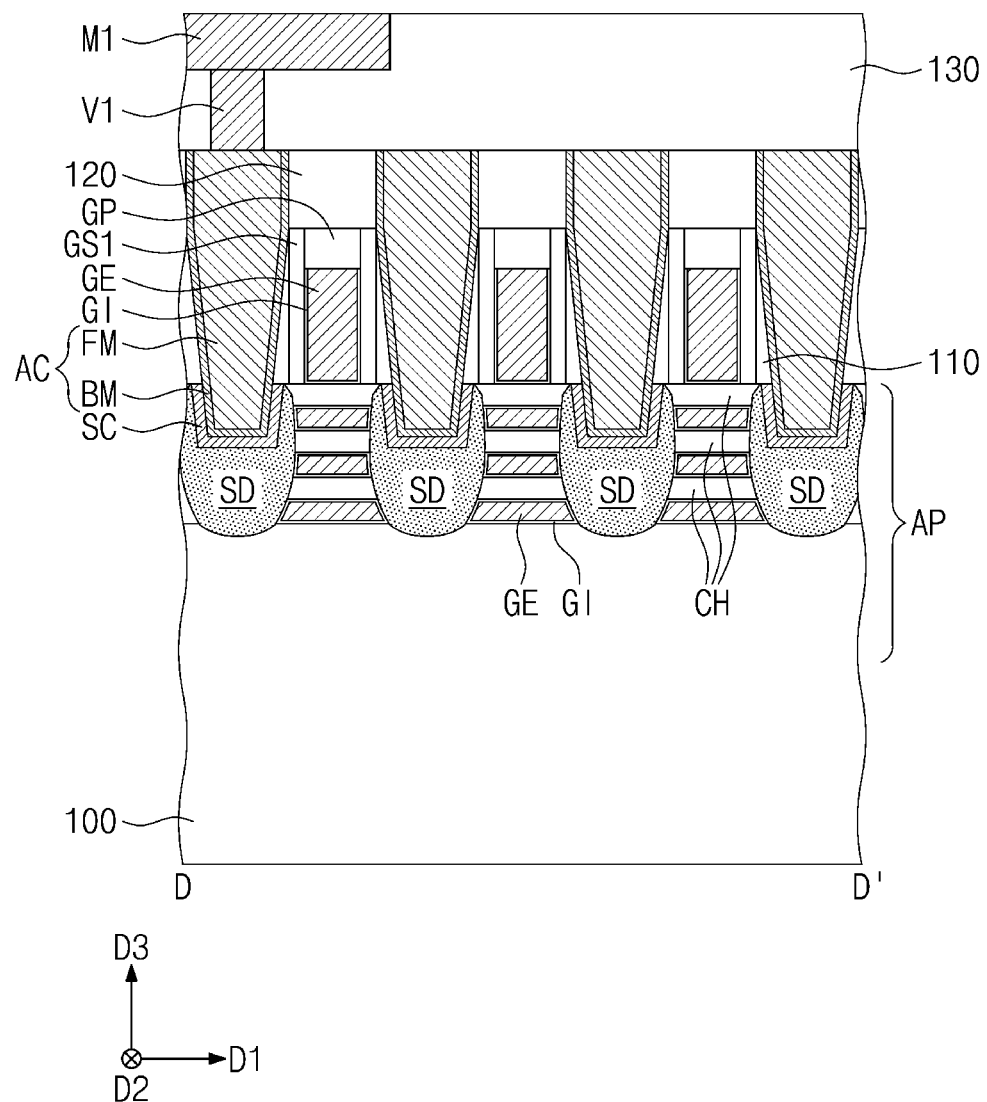
FIGS. 3 and 4 are sectional views, each of which is respectively taken along the line D-D' of FIG. 1A to illustrate a semiconductor device according to an embodiment of the present disclosure.
Figure 4:
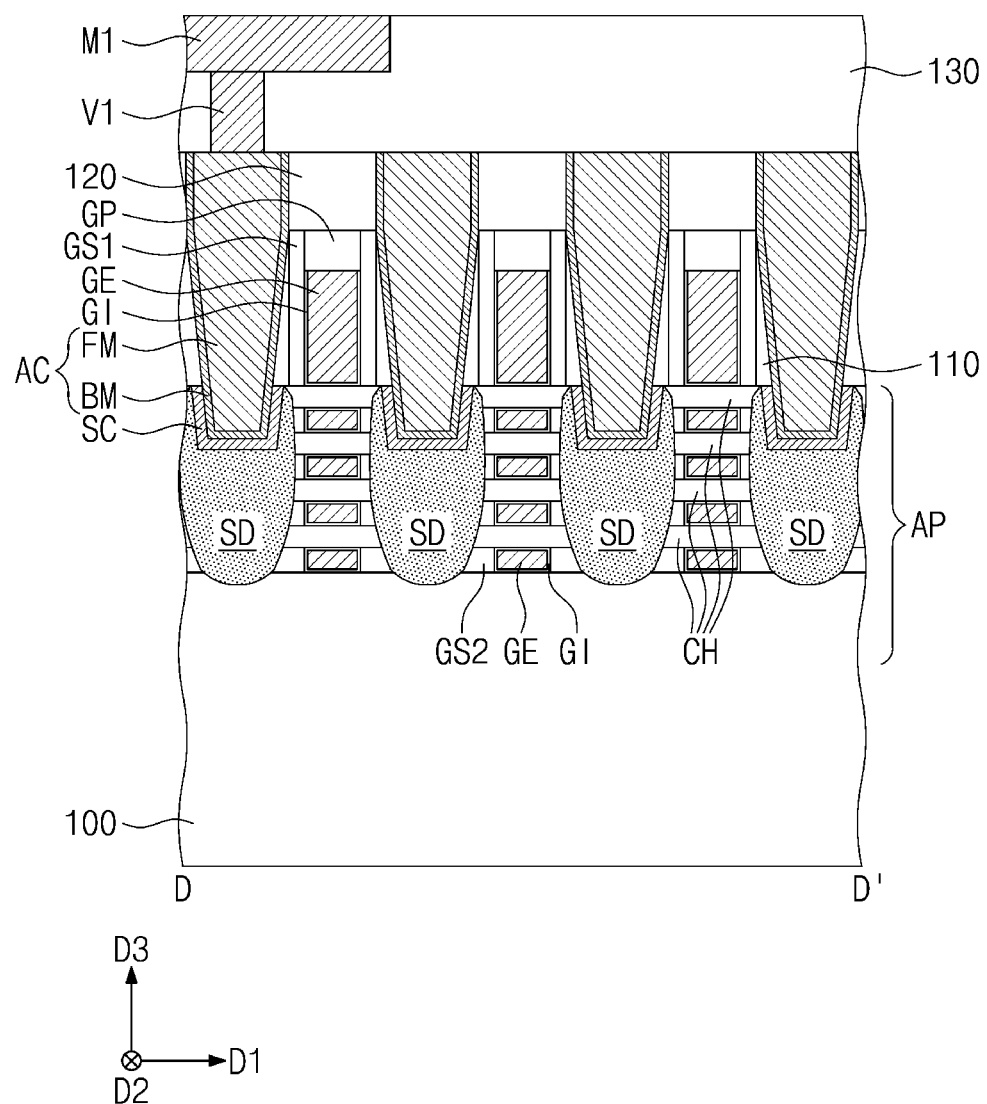

FIGS. 3 and 4 are sectional views, each of which is respectively taken along the line D-D' of FIG. 1A to illustrate a semiconductor device according to an embodiment of the present disclosure. For concise description, a previously-described element may be identified by the same reference number without repeating an overlapping description thereof.

Referring to FIGS. 1A and 3, the plurality of second gate spacers GS2 of FIG. 2D may not be provided. The gate electrodes GE may extend in the first direction D1 between the channel patterns CH and may be spaced apart from each of the plurality of source/drain patterns SD by only the gate insulating pattern GI interposed therebetween. For example, the gate electrode GE may be provided in place of the second gate spacers GS2 of FIG. 2C. In other words, at least a portion of the gate electrode GE may overlap the first portion P1 of each of the channel patterns CH in the third direction D3.

Referring to FIGS. 1A and 4, the number of the channel patterns CH, which are spaced apart from each other in the third direction D3, may be greater than or equal to four. However, the number of the stacked channel patterns CH is not limited to the examples of FIGS. 2D and 4, and in one embodiment, the number of the channel patterns CH stacked in the third direction D3 may be greater than or equal to two.

FIGS. 5A, 6A, 10A, 12A, and 13A are plan views illustrating a method of fabricating a semiconductor device according to one embodiment of the present disclosure and corresponding to the portion 'I' of FIG. 1A. FIGS. 5B, 6B, 11A, 12B, 13B, and 14A are sectional views, each of which is taken along a line A-A' of a corresponding plan view, to illustrate a method of fabricating a semiconductor device according to one embodiment of the present disclosure. FIG. 10B is a sectional view, which is taken along a line B-B' of a corresponding plan view, to illustrate a method of fabricating a semiconductor device according to one embodiment of the present disclosure. FIG. 10C is a sectional view, which is taken along a line C-C' of a corresponding plan view, to illustrate a method of fabricating a semiconductor device according to one embodiment of the present disclosure. FIGS. 5C, 6C, 7, 8, 9, 10D, 11B, 12C, and 14B are sectional views, each of which is taken along a line D-D' of a corresponding plan view, to illustrate a method of fabricating a semiconductor device according to one embodiment of the present disclosure.

Hereinafter, the fabrication method will be described in more detail with reference to FIGS. 5A to 14B.

Figure 5A:
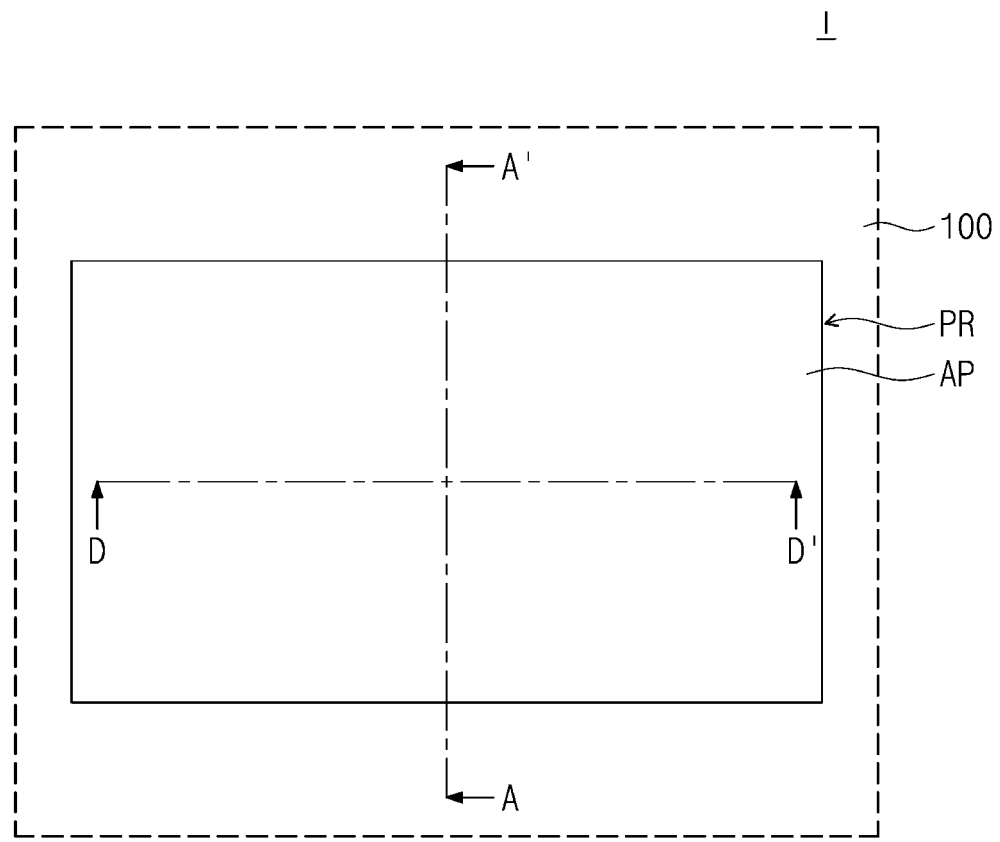
FIGS. 5A, 6A, 10A, 12A, and 13A are plan views illustrating a method of fabricating a semiconductor device according to an embodiment of the present disclosure and corresponding to the portion 'I' of FIG. 1A.
Figure 5A:
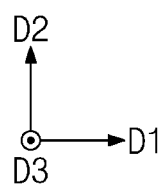
Figure 5B:
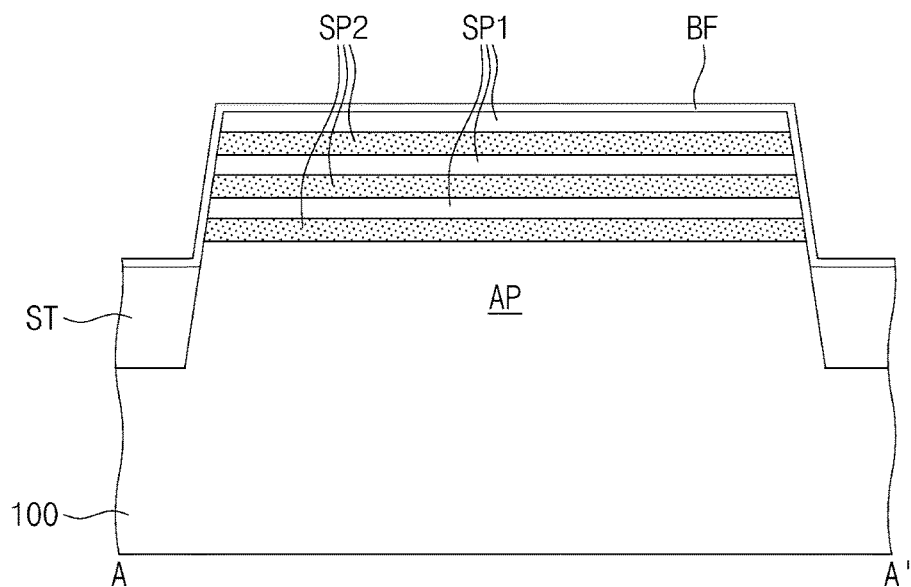
FIGS. 5B, 6B, 11A, 12B, 13B, and 14A are sectional views, each of which is taken along a line A-A' of a corresponding plan view, to illustrate a method of fabricating a semiconductor device according to an embodiment of the present disclosure.
Figure 5B:
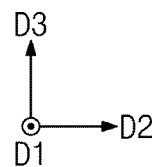
Figure 5C:
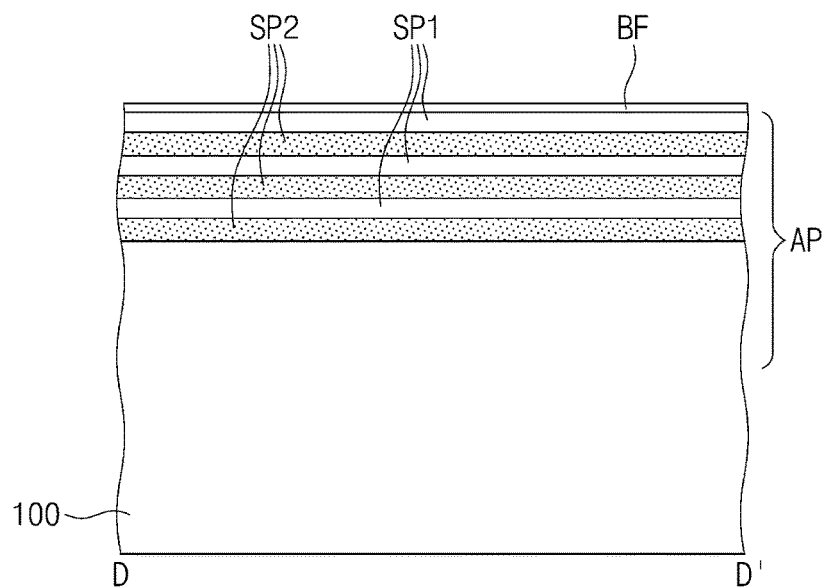
FIGS. 5C, 6C, 7, 8, 9, 10D, 11B, 12C, and 14B are sectional views, each of which is taken along a line D-D' of a corresponding plan view, to illustrate a method of fabricating a semiconductor device according to an embodiment of the present disclosure.
Figure 5C:
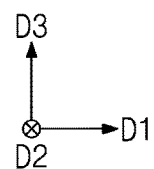

Referring to FIGS. 5A, 5B, and 5C, the substrate 100 may be provided in the form of a plate extended in the first and second directions D1 and D2, and in one embodiment, the substrate 100 may be formed of or include a semiconductor material. First and second semiconductor layers may be alternately and repeatedly stacked on the substrate 100. The second semiconductor layer may be formed of or include a material having an etch selectivity with respect to the first semiconductor layer. For example, the first and second semiconductor layers may be formed of or include at least one of silicon (Si), germanium (Ge), or silicon germanium (SiGe), but the materials for the first and second semiconductor layers may be different from each other. As an example, the first semiconductor layers may be formed of or include silicon (Si), and the second semiconductor layers may be formed of or include silicon germanium (SiGe).

A patterning process may be performed on the substrate and the first and second semiconductor layers. For example, the patterning process may be performed to form a trench defining the active pattern AP. The device isolation layer ST may be formed in the trench. The device isolation layer ST may be formed of or include, for example, silicon oxide. The device isolation layer ST may be recessed such that an upper portion of the active pattern AP protrudes above the device isolation layer ST.

During the patterning process, the first and second semiconductor layers may be partially removed to form first semiconductor patterns SP1 and second semiconductor patterns SP2, respectively. The first and second semiconductor patterns SP1 and SP2 may be alternately and repeatedly stacked on the active pattern AP.

A buffer layer BF may be formed on a portion of the active pattern AP protruding above the device isolation layer ST. The buffer layer BF may cover at least a portion of side surfaces of the first and second semiconductor patterns SP1 and SP2 and at least a portion of a top surface of the uppermost one of the first semiconductor patterns SP1. Furthermore, the buffer layer BF may extend to cover at least a portion of the top surface of the device isolation layer ST. The buffer layer BF may be formed of or include, for example, silicon oxide.

Figure 6A:
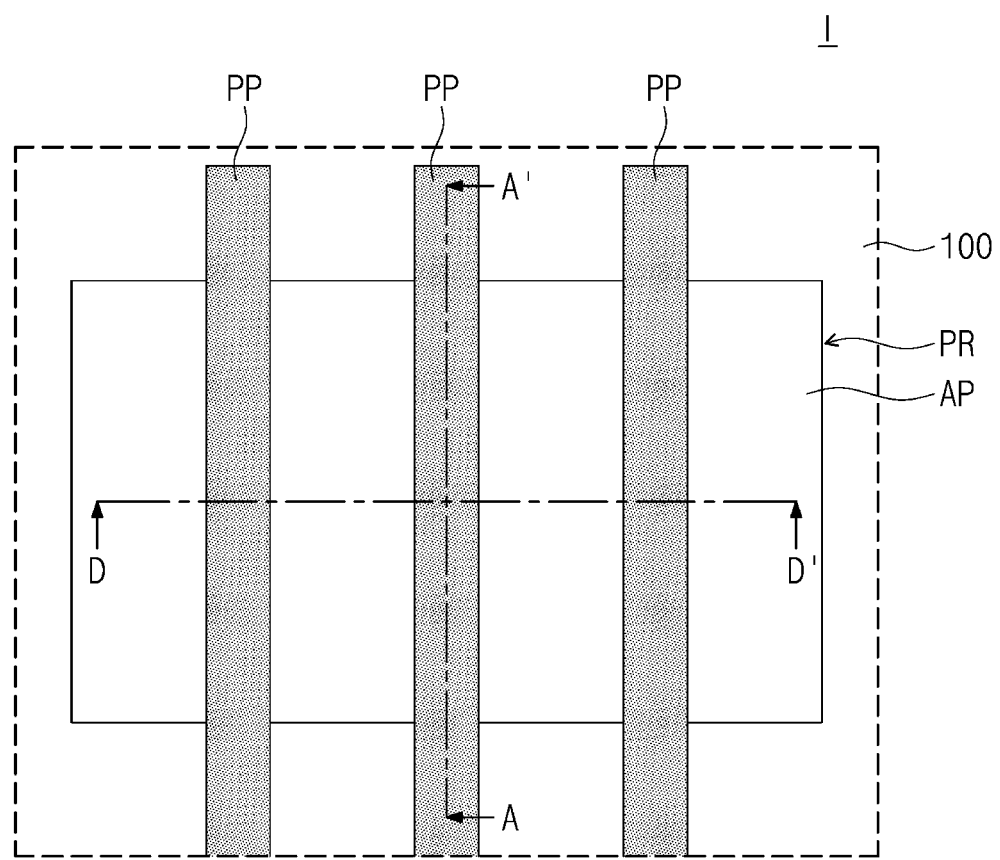
Figure 6B:
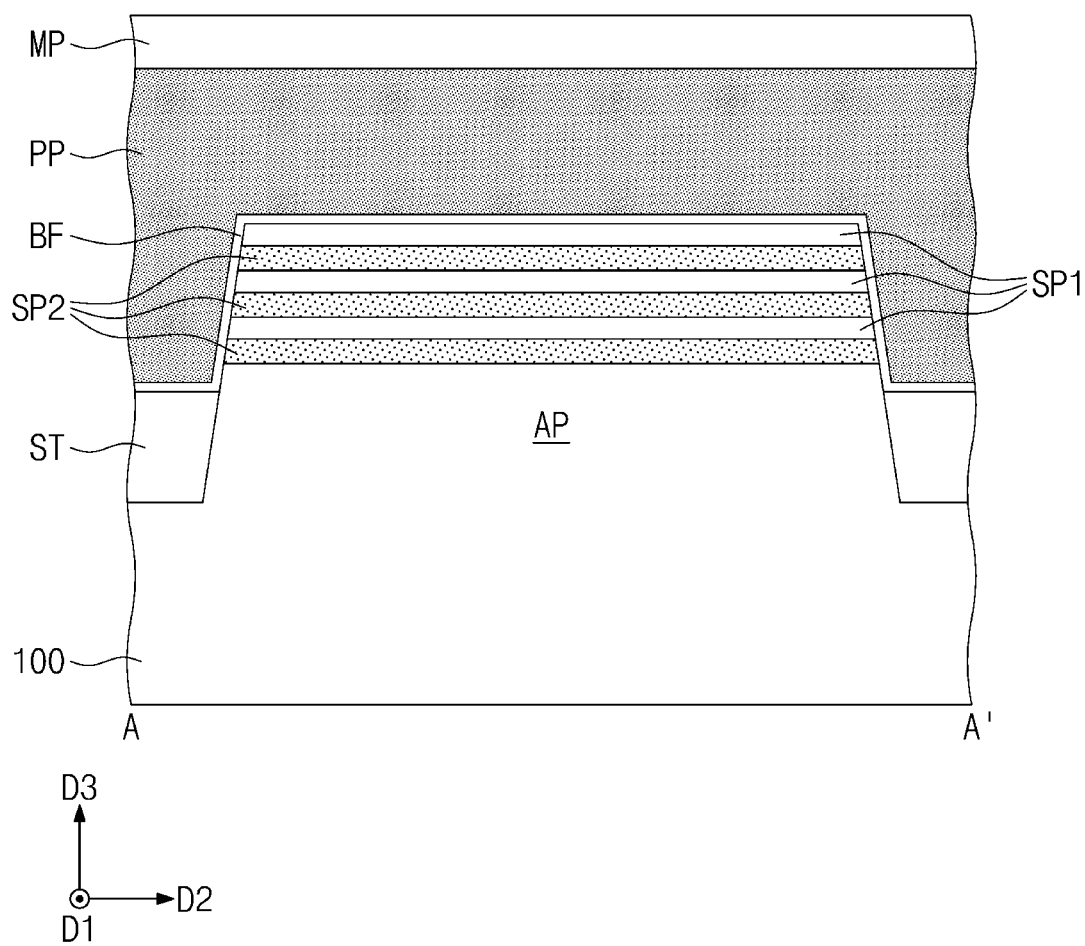
Figure 6C:
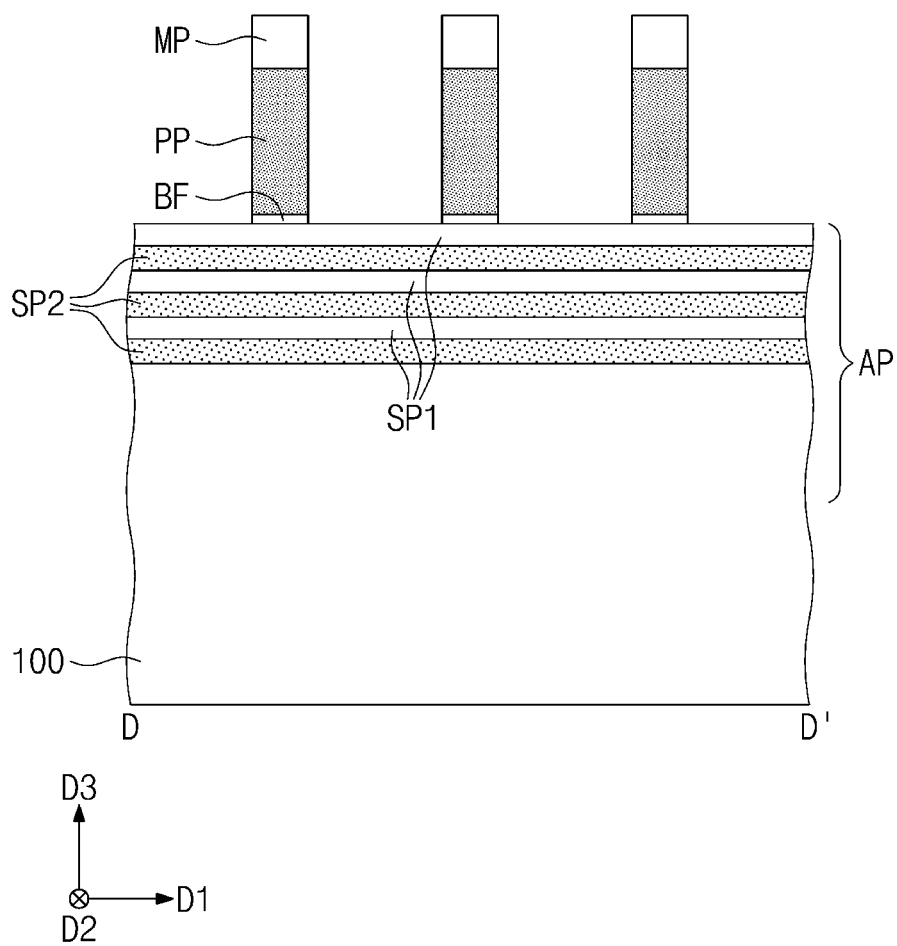

Referring to FIGS. 6A, 6B, and 6C, at least one sacrificial pattern PP may be formed to cross the active pattern AP. The at least one sacrificial pattern PP may be formed to have a line or bar shape extending in the second direction D2. The at least one sacrificial pattern PP may include a plurality of sacrificial patterns PP. The plurality of sacrificial patterns PP may be spaced apart from each other in the first direction D1. One of the sacrificial patterns PP will be described below, but the remaining ones of the sacrificial patterns PP may also have substantially the same features as described below.

The formation of the sacrificial pattern PP may include forming a sacrificial layer on the substrate 100, forming a hard mask pattern MP on the sacrificial layer, and patterning the sacrificial layer and the buffer layer BF using the hard mask pattern MP as an etch mask. The sacrificial layer may be formed of or include, for example, poly silicon. The hard mask pattern MP may be formed of or include, for example, silicon nitride.

Figure 7:
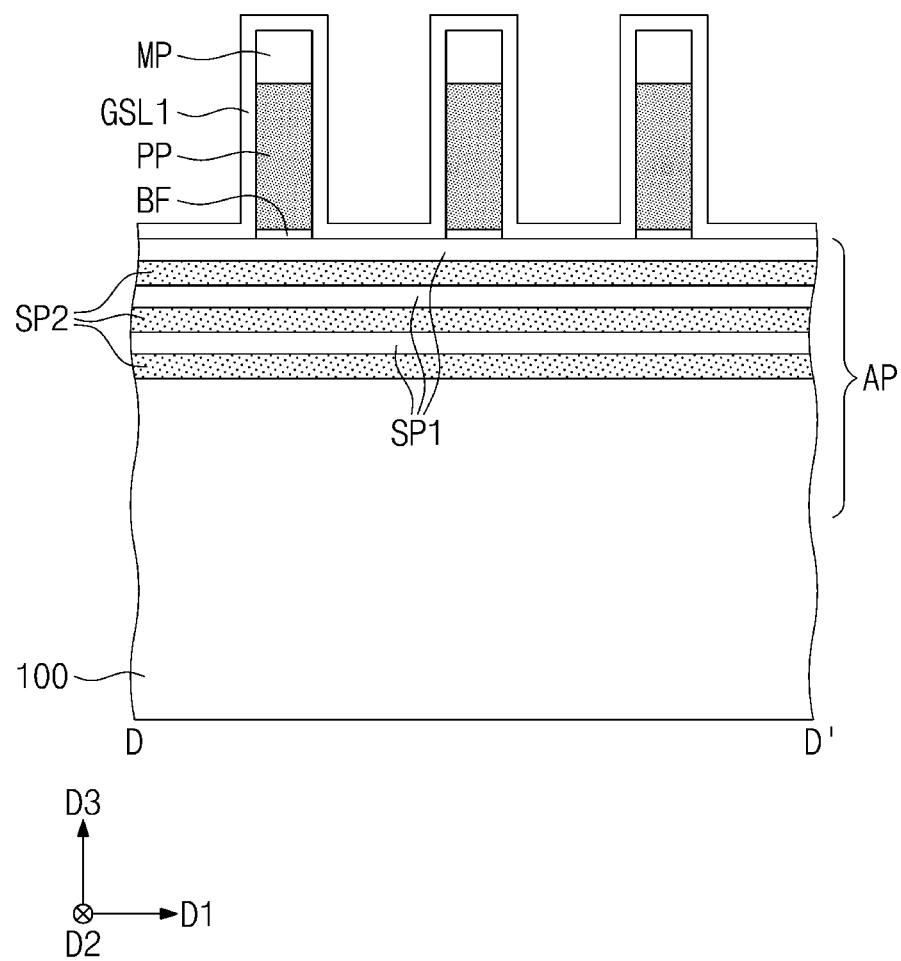

Referring to FIG. 7, a first gate spacer layer GSL1 may be formed on at least a portion of a top surface of the uppermost one of the first semiconductor patterns SP1, at least a portion of a top surface of the hard mask pattern MP, and at least a portion of side surfaces of the hard mask pattern MP, the sacrificial pattern PP, and the buffer layer BF. The first gate spacer layer GSL1 may be formed of or include, for example, silicon nitride.

Figure 8:
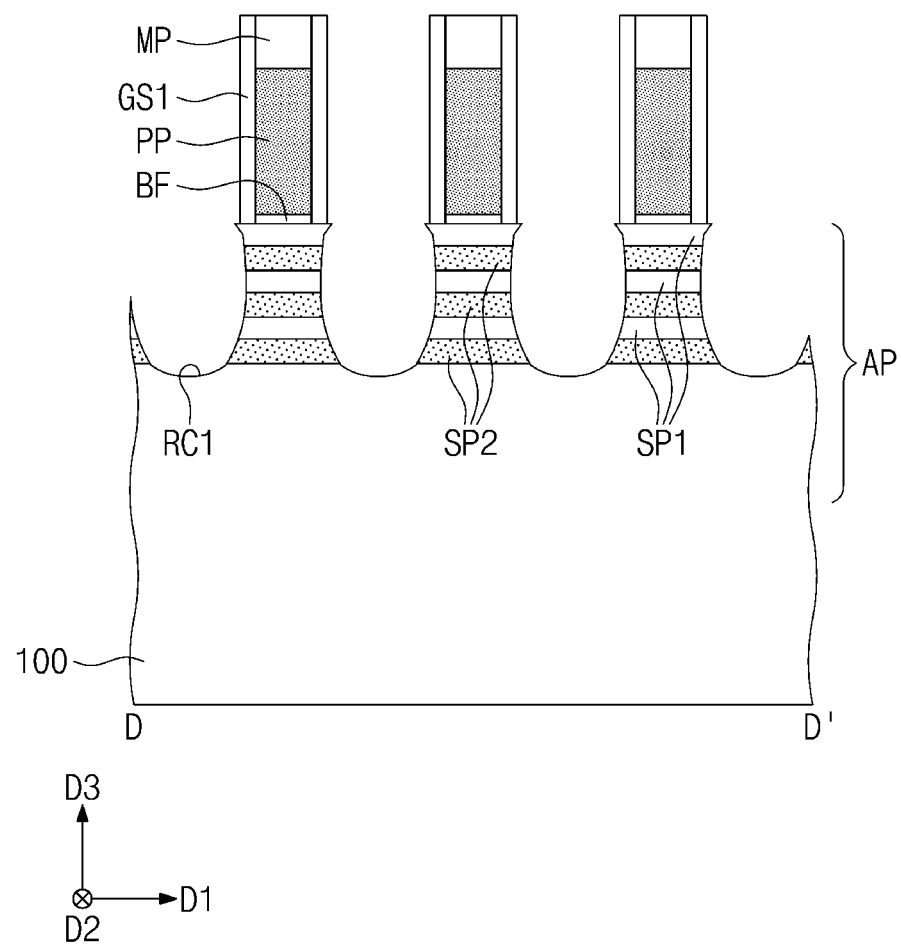

Referring to FIGS. 7 and 8, portions of the first gate spacer layer GSL1, which covers at least a portion of the top surface of the uppermost one of the first semiconductor patterns SP1 and at least a portion of the top surface of the hard mask pattern MP, may be removed to form the first gate spacers GS1 covering opposite side surfaces of the sacrificial pattern PP.

The active pattern AP may be partially recessed to form a plurality of first recessed portions RC1. The first recessed portions RC1 may be formed at both sides of the sacrificial pattern PP. The plurality of first recessed portions RC1 may be formed by etching an upper portion of the active pattern AP using the hard mask pattern MP and the first gate spacers GS1 as an etch mask.

Figure 9:
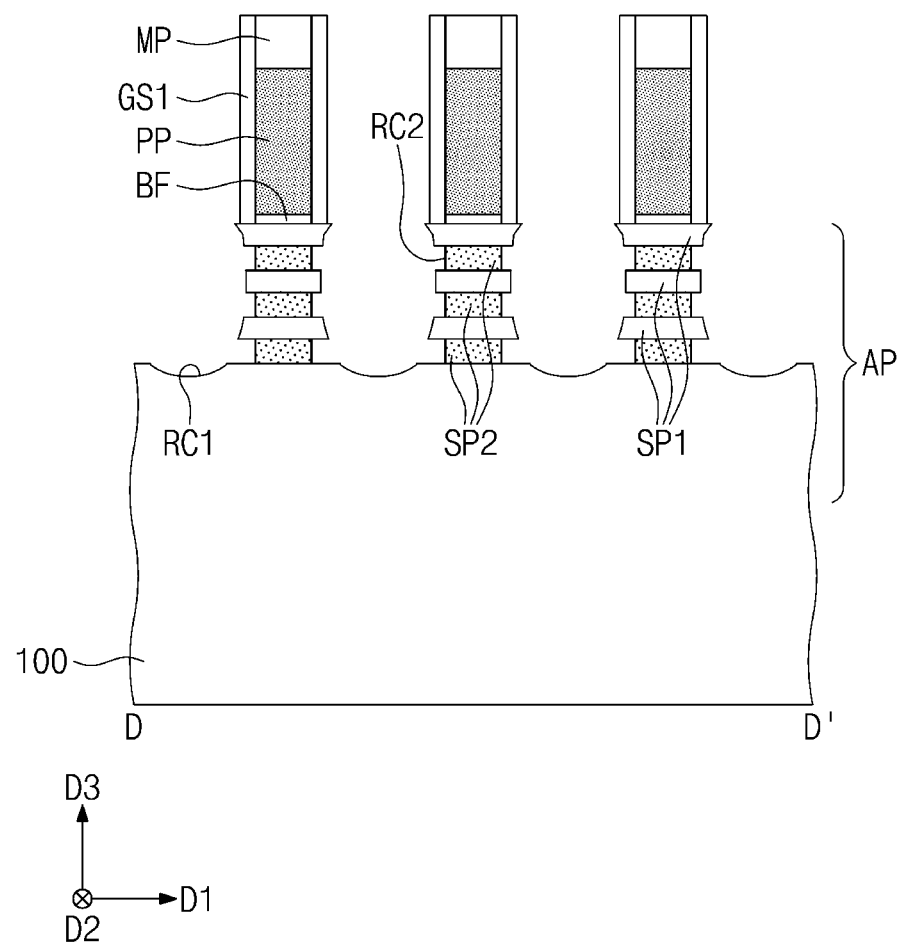

Referring to FIG. 9, a plurality of second recessed portions RC2 may be respectively formed by recessing the second semiconductor patterns SP2, which are exposed through the first recessed portions RC1, in the first direction D1. The first semiconductor patterns SP1, which are exposed through the first recessed portions RC1, may not be removed during the formation of the second recessed portions RC2.

Referring to FIGS. 10A, 10B, 10C, and 10D, a plurality of second gate spacers GS2 may be formed to completely or partially fill the second recessed portions RC2. The plurality of second gate spacers GS2 may be formed of or include, for example, silicon nitride. The formation of the plurality of second gate spacers GS2 may include forming a second gate spacer layer to completely or partially fill the second recessed portions RC2 and at least a portion of the first recessed portions RC1 and removing a portion of the second gate spacer layer formed in the first recessed portions RC1. Referring to FIG. 10C, the plurality of second gate spacers GS2 may be formed to completely or partially fill spaces which are provided between the first semiconductor patterns SP1 and between the sacrificial pattern PP and the plurality of source/drain patterns SD.

Next, the plurality of source/drain patterns SD may be formed to at least partially fill the first recessed portions RC1, which are formed in the upper portion of the active pattern AP. The source/drain patterns SD may be respectively formed at both sides of the sacrificial pattern PP. The top surface of each of the plurality of source/drain patterns SD is illustrated to be substantially coplanar with the top surface of the uppermost one of the first semiconductor patterns SP1, but the present disclosure is not limited to this example. For example, each of the plurality of source/drain patterns SD may be formed such that its top surface is located at a level higher than the top surface of the uppermost one of the first semiconductor patterns SP1. Referring to FIG. 10B, the bottom surface SDb of each of the plurality of source/drain patterns SD may be located at a level lower than the top surface STt of the device isolation layer ST, where an upper level of the substrate may serve as a base reference layer.

The plurality of source/drain patterns SD may be formed by a selective epitaxial growth process using the top surface of the active pattern AP, which is exposed through the first recessed portions RC1, and inner side surfaces of the first recessed portions RC1 as a seed layer. As an example, during the selective epitaxial growth process, the plurality of source/drain patterns SD may be doped with impurities in situ. As another example, impurities may be injected into the source/drain patterns SD, after the formation of the source/drain patterns SD.

Figure 11A:
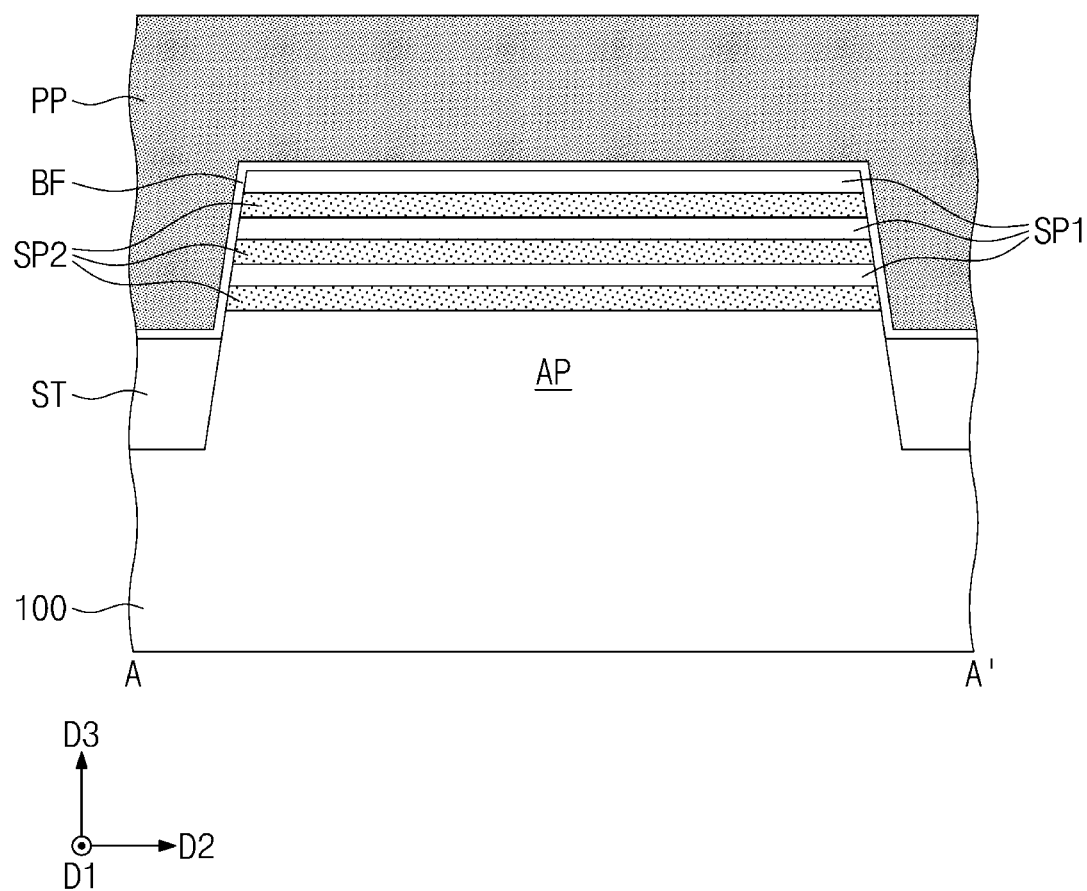
Figure 11B:
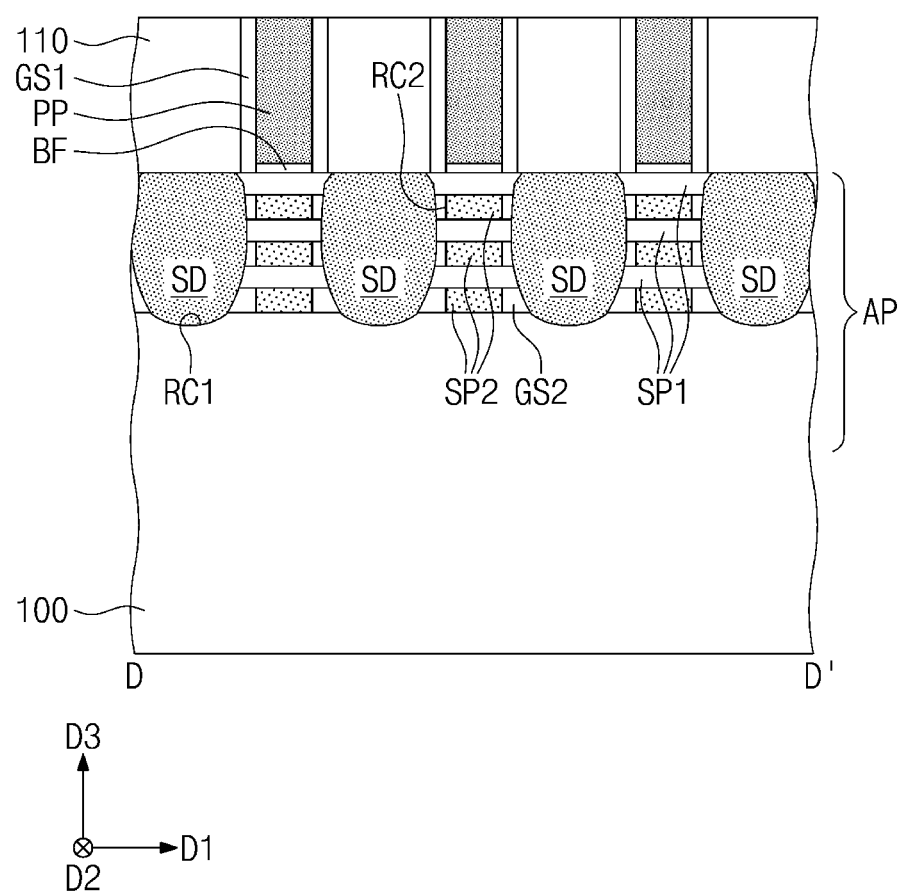

Referring to FIGS. 11A and 11B, a first interlayer insulating layer 110 may be formed to at least partially cover side surfaces of the first plurality of gate spacers GS1, top surfaces of the plurality of source/drain patterns SD, and a portion of the top surface of the active pattern AP which is not covered with the sacrificial pattern PP. The hard mask pattern MP on the sacrificial pattern PP may be removed through a planarization process. In one embodiment, the planarization process may be an etch-back process or a chemical mechanical polishing (CMP) process. The first interlayer insulating layer 110 may also be removed during the planarization process. The top surface of the first interlayer insulating layer 110 may be substantially coplanar with top surfaces of the first gate spacers GS1 and a top surface of the sacrificial pattern PP.

Figure 10A:
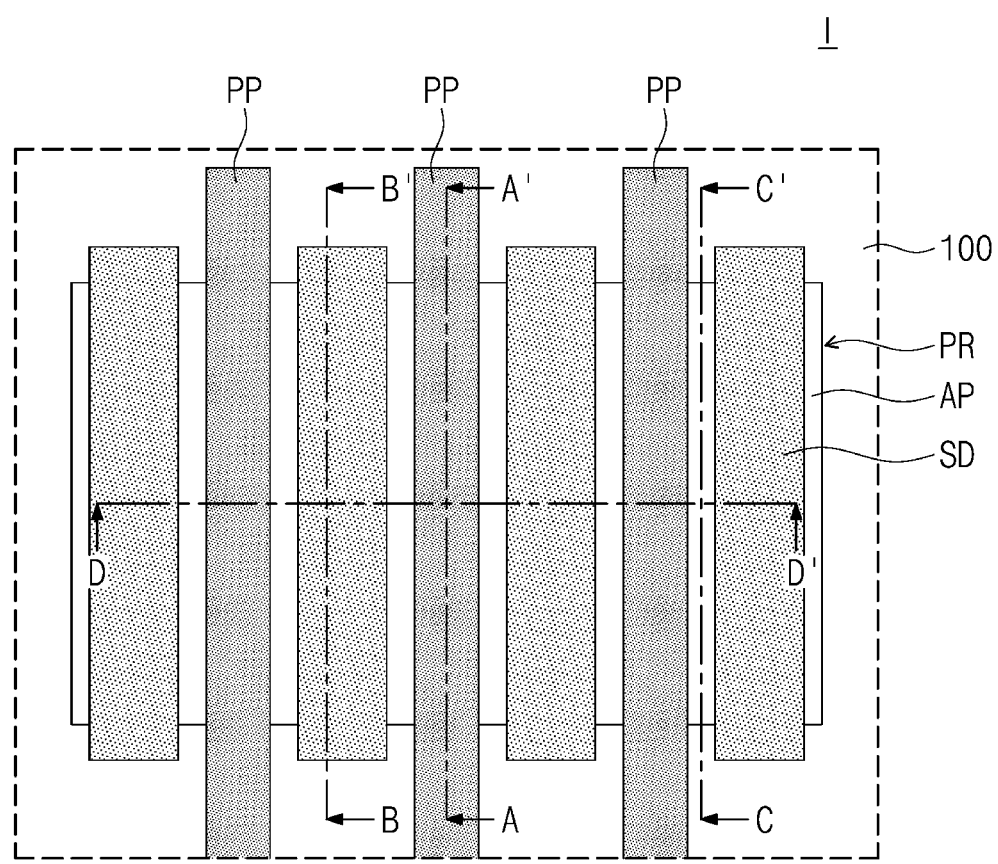
Figure 10B:
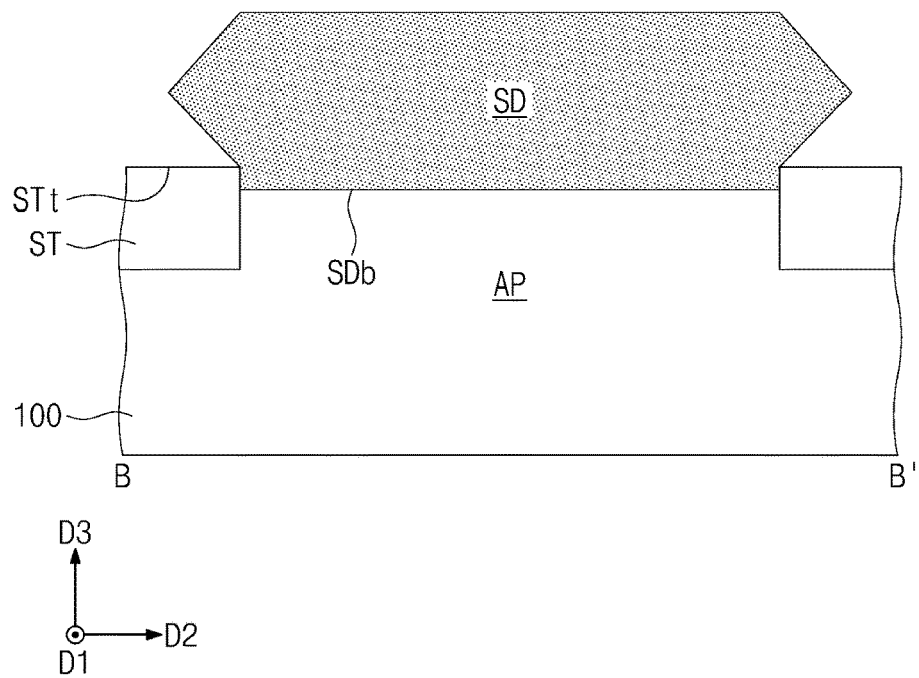
FIG. 10B is a sectional view, which is taken along a line B-B' of a corresponding plan view, to illustrate a method of fabricating a semiconductor device according to an embodiment of the present disclosure.
Figure 10C:
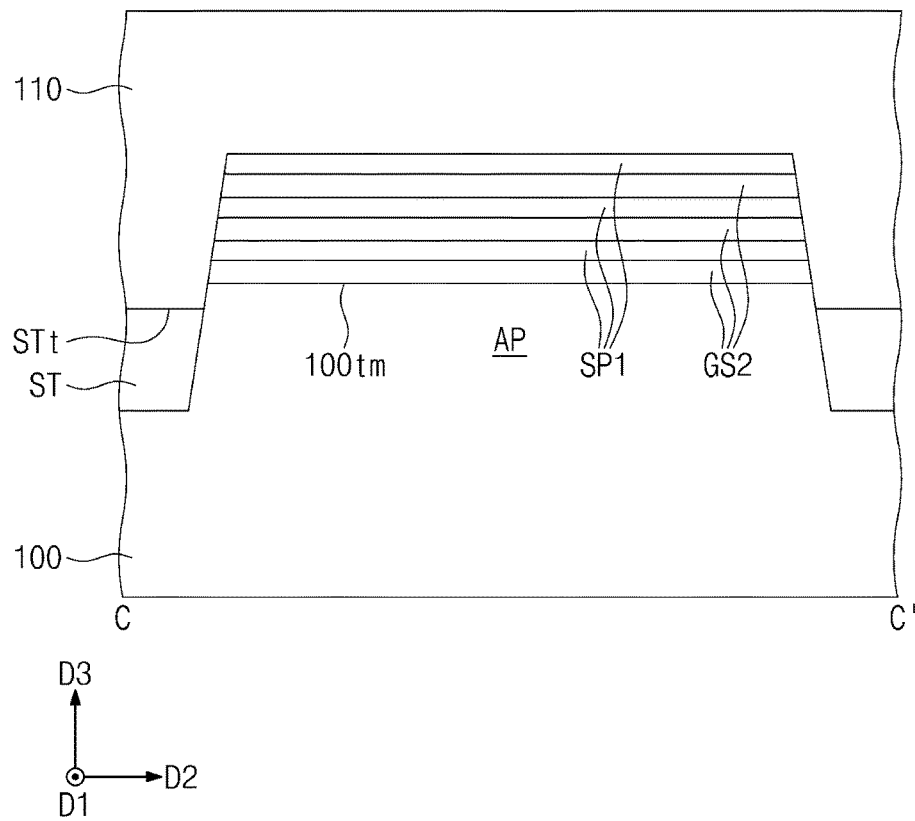
FIG. 10C is a sectional view, which is taken along a line C-C' of a corresponding plan view, to illustrate a method of fabricating a semiconductor device according to an embodiment of the present disclosure.
Figure 10D:
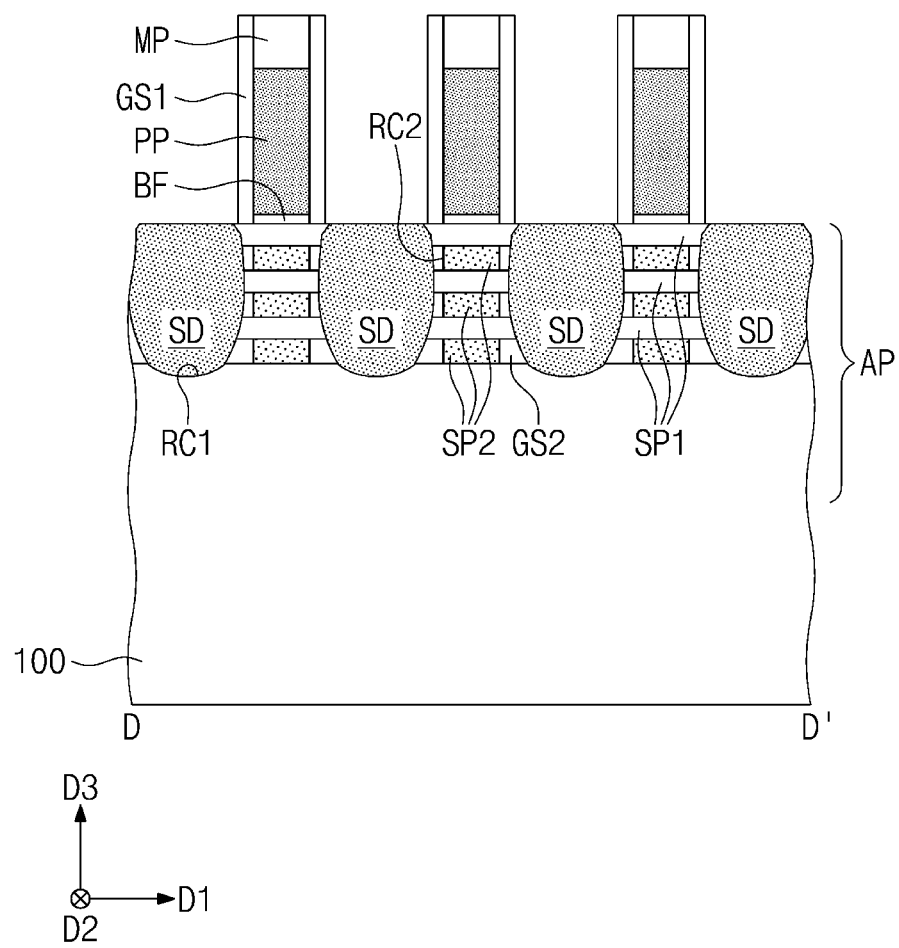
Figure 12A:
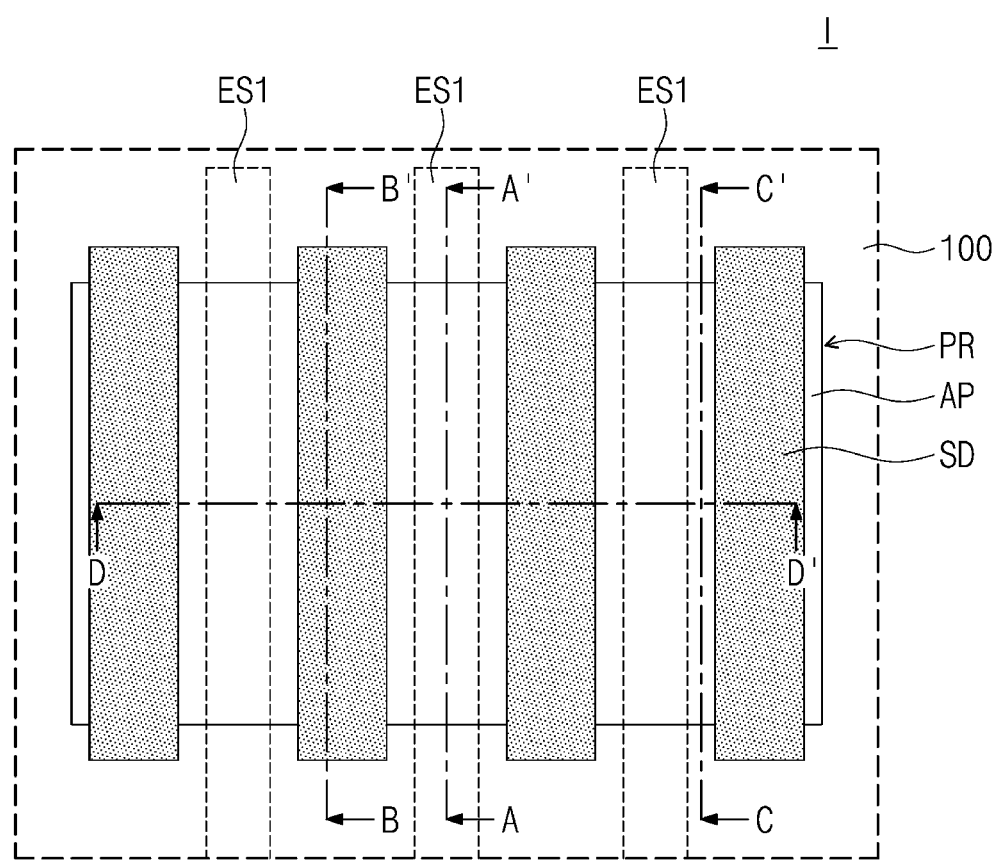
Figure 12B:
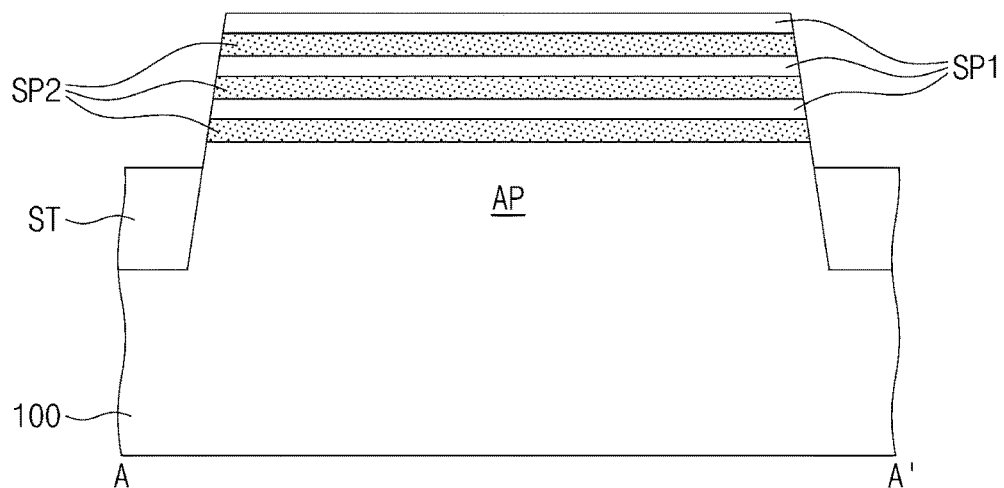
Figure 12C:
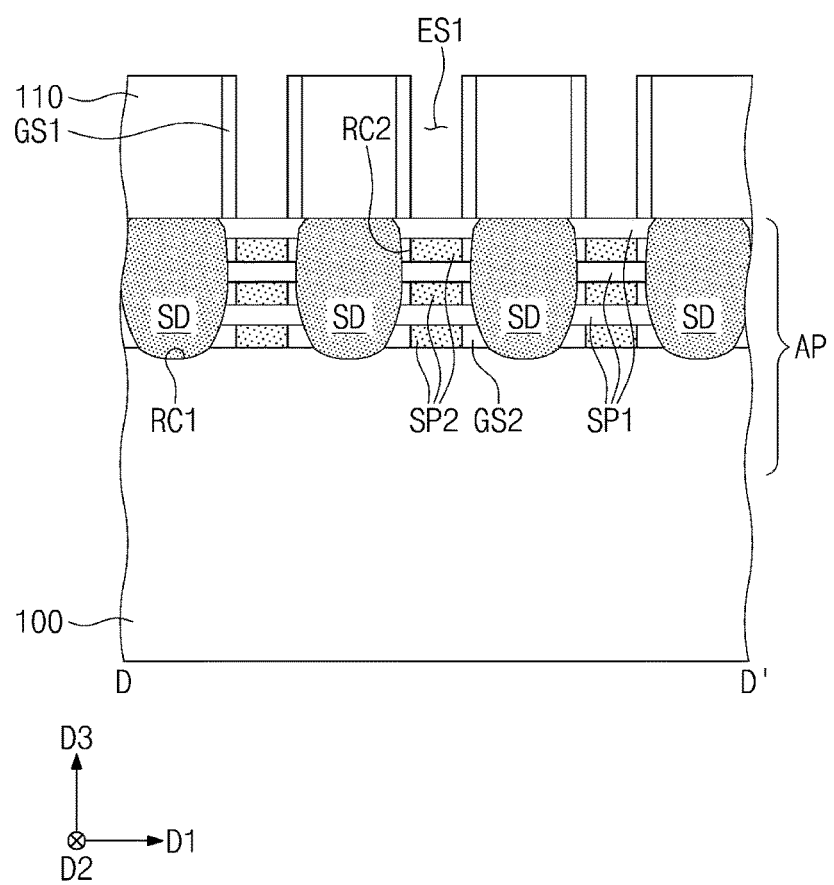

Referring to FIGS. 12A, 12B, and 12C in conjunction with FIGS. 10A, 11A, and 11C, the sacrificial pattern PP on the active pattern AP may be removed. An empty space, which is formed between the first gate spacers GS1 by the removal of the sacrificial pattern PP, may be referred to as a first empty space ES1. In one embodiment, the buffer layer BF below the sacrificial pattern PP may also be removed during the process of removing the sacrificial pattern PP. As a result of the removal of the sacrificial pattern PP, side surfaces of the first gate spacers GS1 and a top surface of the uppermost one of the first semiconductor patterns SP1 may be exposed to the outside.

Figure 13A:
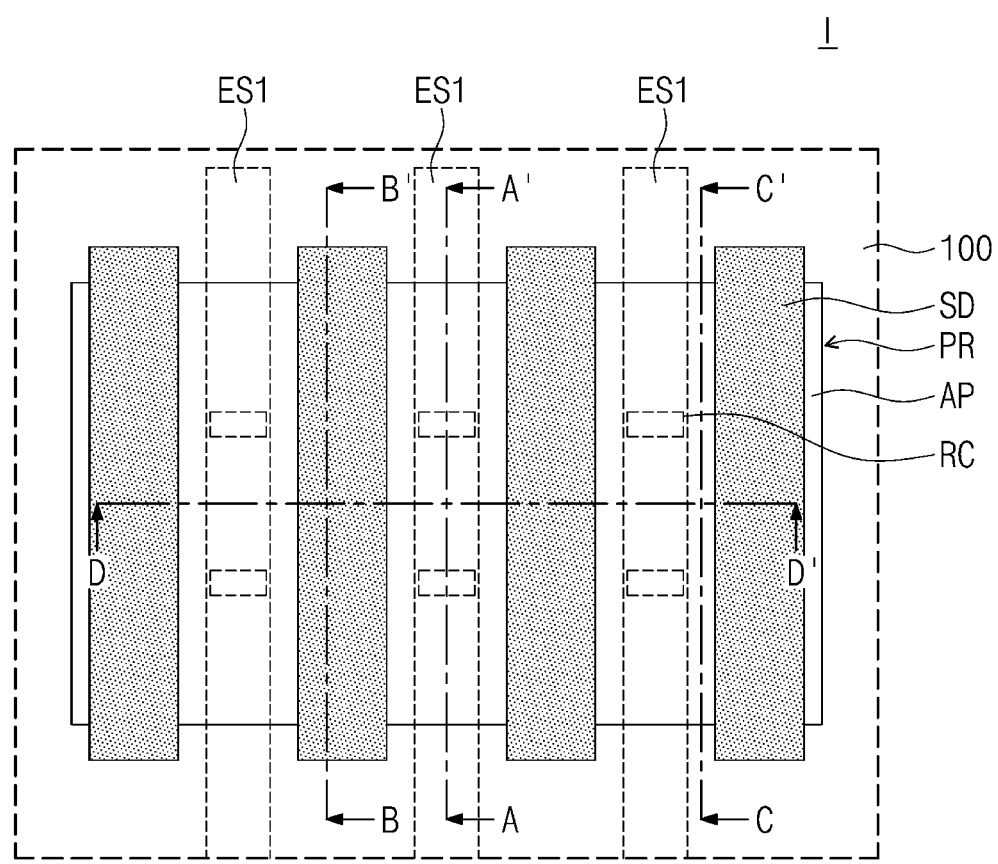
Figure 13B:
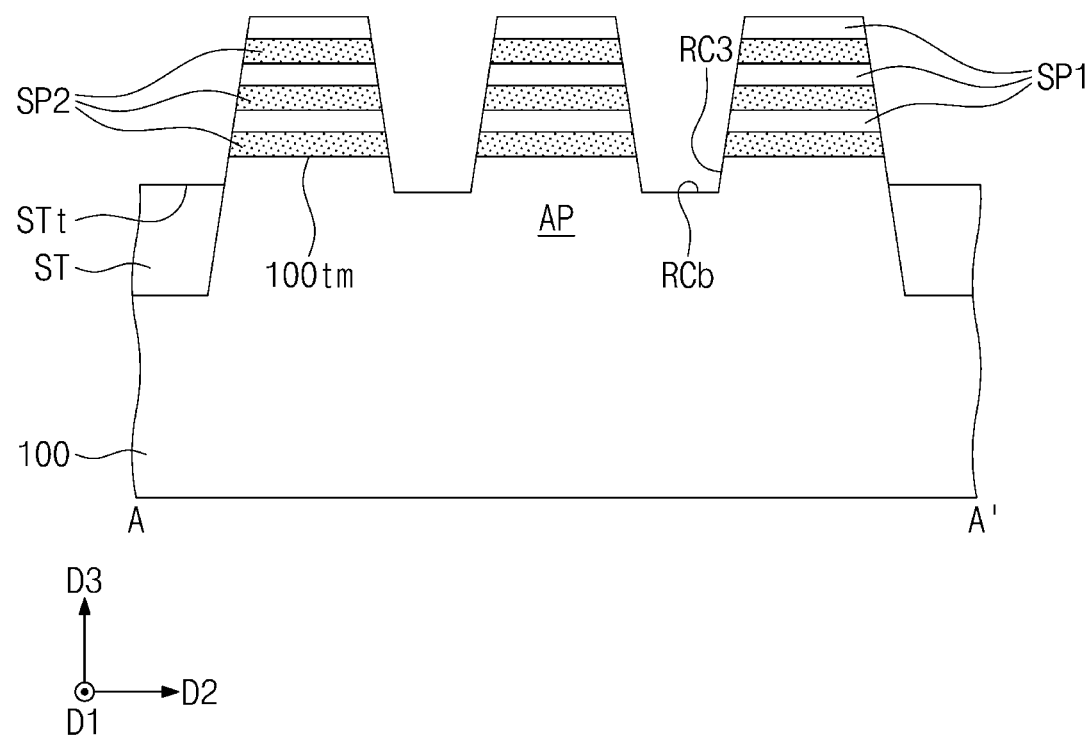

Referring to FIGS. 13A and 13B, at least one third recessed portion RC3 may be formed by performing a patterning process on the first and second semiconductor patterns SP1 and SP2, which are exposed by the first empty space ES1. The bottom surface RCb of the third recessed portion RC3 may be located at a level lower than a topmost surface 100tm of the substrate 100, where an upper level of the substrate may serve as a base reference layer. In the first empty space ES1, each of the first and second semiconductor patterns SP1 and SP2 may include portions which are spaced apart from each other in the second direction D2. The third recessed portion RC3 may correspond to the recessed portion RC in FIGS. 1A, 1B, and 2A.

Figure 14A:
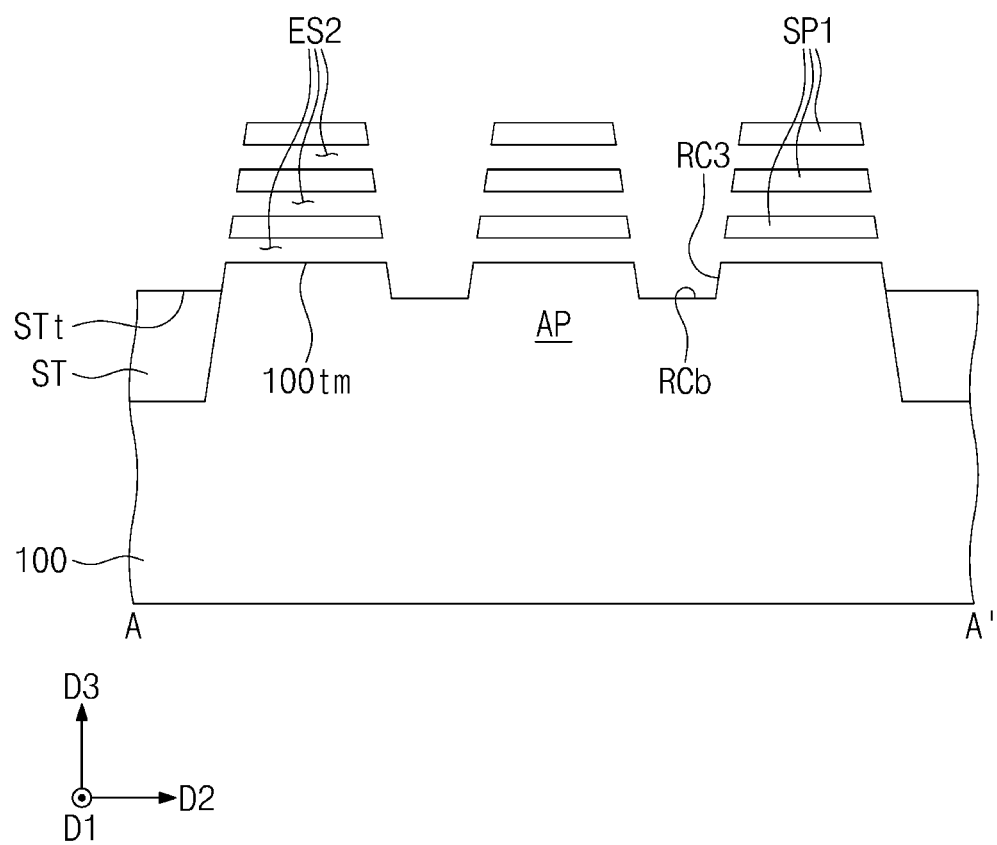
Figure 14B:
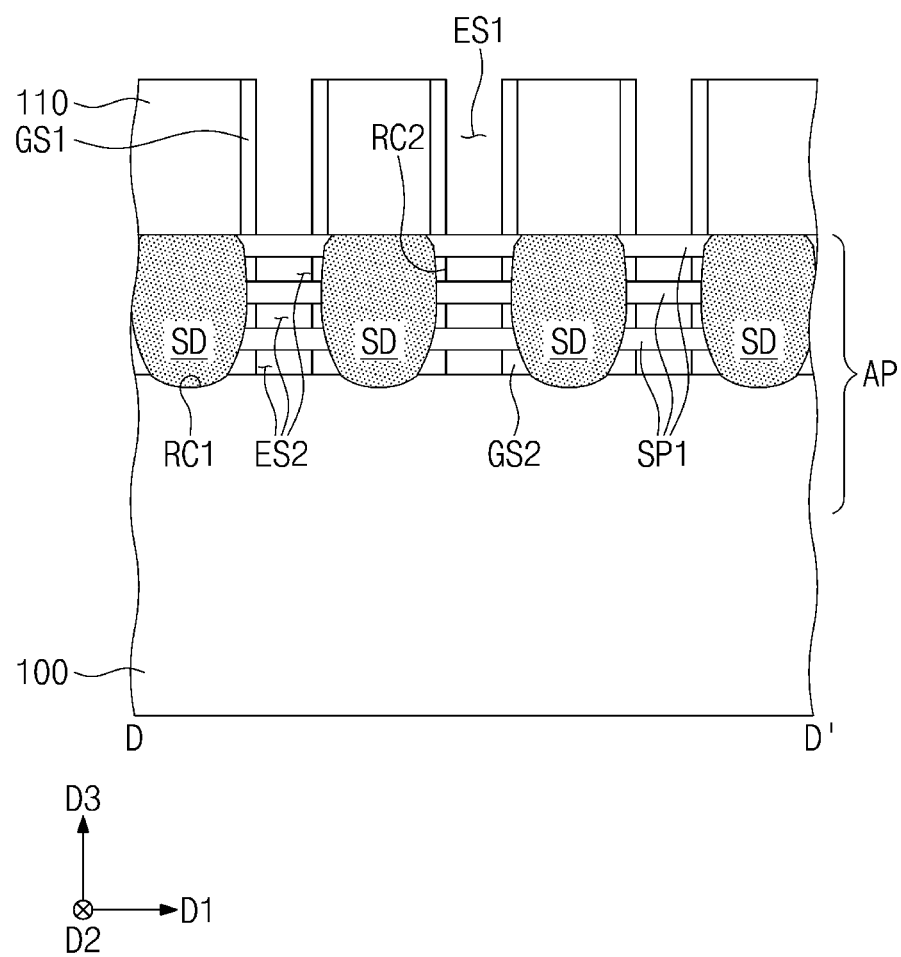

Referring to FIGS. 14A and 14B, the second semiconductor patterns SP2 may be selectively removed. Empty spaces, which are formed between the first semiconductor patterns SP1 by the selectively removal of the second semiconductor patterns SP2, may be referred to as second empty spaces ES2. As a result of the removal of the second semiconductor patterns SP2, side surfaces of the second gate spacers GS2 and top and bottom surfaces of the first semiconductor patterns SP1 may be exposed to the outside.

Referring to FIGS. 14A and 14B in conjunction with FIGS. 1A, 1B, 2A, 2B, 2C, and 2D, the gate electrode GE may be formed to completely or partially fill the first and second empty spaces ES1 and ES2. Before the formation of the gate electrode GE, the gate insulating pattern GI may be formed on, and conform to, at least a portion of side, top, and bottom surfaces of the first and second empty spaces ES1 and ES2. The first semiconductor patterns SP1 may be referred to as the channel patterns CH.

Next, the gate capping pattern GP may be formed on the gate electrode GE. The formation of the gate capping pattern GP may include recessing a portion of the gate electrode GE at least partially filling the first empty space ES1, forming a capping layer to at least partially fill the recessed space of the gate electrode GE, and performing a planarization process to remove a portion of the capping layer. The gate capping pattern GP may be formed of or include, for example, silicon nitride. The top surface of the gate capping pattern GP may be substantially coplanar with the top surfaces of the first gate spacers GS1.

The second interlayer insulating layer 120 may be formed on the top surface of the first interlayer insulating layer 110 and on the top surface of the gate capping pattern GP. The active contacts AC may be formed to penetrate the first and second interlayer insulating layers 110 and 120 and may be electrically connected to the source/drain patterns SD. The gate contacts GC may be provided to penetrate the second interlayer insulating layer 120 and the gate capping pattern GP and may be electrically connected to the gate electrodes GE.

The third interlayer insulating layer 130 may be formed on the active contacts AC and the gate contact GC. A first metal layer may be formed in the third interlayer insulating layer 130, and in one embodiment, the first metal layer may include the first interconnection lines M1, the first via V1, and the second via V2. Additional metal layers (e.g., M2, M3, M4, and so forth) may be further stacked on the third interlayer insulating layer 130.

In the case where a plurality of channel patterns, which are vertically spaced apart (i.e., spaced apart in a direction perpendicular to a plane defined by an upper surface of the substrate) from each other to connect source/drain patterns to each other, are formed to have an increased length in a horizontal direction, various difficulties may occur in a fabrication process. For example, in a process of selectively etching a semiconductor layer between the channel patterns, it may be difficult to completely remove the semiconductor layer. However, according to an embodiment of the present disclosure, it may be possible to overcome such difficulties, to minimize a pitch of the channel patterns, and to improve electrical characteristics and reliability of the semiconductor device.

While example embodiments of the present disclosure have been particularly shown and described, it will be understood by one of ordinary skill in the art that variations in form and detail may be made therein without departing from the spirit and scope of the attached claims.

What is claimed is:

1. A semiconductor device, comprising:
an active pattern on a substrate and extending in a first direction parallel to an upper surface of the substrate;
a pair of source/drain patterns on the active pattern and spaced apart from each other in the first direction;
a gate electrode that is between the pair of source/drain patterns, crosses the active pattern, and extends in a second direction parallel to the upper surface of the substrate that is different from the first direction; and
a plurality of channel patterns stacked on the active pattern between the pair of source/drain patterns and configured to electrically connect the pair of source/drain patterns to each other,
wherein each of the channel patterns is spaced apart from another one of the channel patterns in a third direction perpendicular to the upper surface of the substrate,
wherein each of the channel patterns comprises: a first portion between the gate electrode and at least one of the pair of source/drain patterns in a plan view; and a plurality of second portions in contact with the first portion and overlapped with the gate electrode in the third direction,
wherein each of the second portions is spaced apart from another one of the second portions in the second direction,
wherein a top surface of the active pattern comprises a first recessed portion that is between the pair of source/drain patterns in the first direction, in a plan view, and
wherein the first recessed portion is between two of the second portions in the second direction, in a plan view.

2. The semiconductor device of claim 1, wherein a width of the first recessed portion in the second direction ranges from about five (5) nanometers (nm) to about forty (40) nm.

3. The semiconductor device of claim 1, wherein a width of the first recessed portion in the first direction is equal to a width of the gate electrode in the first direction.

4. The semiconductor device of claim 1, further comprising a device isolation layer on the substrate to define the active pattern,
wherein a bottom surface of the first recessed portion is located at a level lower than a top surface of the device isolation layer, where an upper layer of the substrate serves as a base reference layer.

5. The semiconductor device of claim 1, wherein the top surface of the active pattern comprises a second recessed portion,
wherein the second recessed portion is between two of the second portions in the second direction, in a plan view, and
wherein the first recessed portion and the second recessed portion are spaced apart from each other in the second direction.

6. The semiconductor device of claim 1, wherein a length of at least one of the second portions in the second direction is smaller than a length of the first portion in the second direction.

7. The semiconductor device of claim 1, wherein a length of the first portion in the second direction is smaller than a length of each of the pair of source/drain patterns in the second direction.

8. The semiconductor device of claim 1, further comprising a device isolation layer on the substrate to define the active pattern,
wherein a bottom surface of each of the pair of source/drain patterns is located at a level lower than a top surface of the device isolation layer, where an upper layer of the substrate serves as a base reference layer, and
wherein the gate electrode is on at least a portion of a top surface of the device isolation layer, at least a portion of a top surface of the active pattern, and at least a portion of top and bottom surfaces of each of the channel patterns.

9. The semiconductor device of claim 1, wherein a width of a bottom surface of each of the pair of source/drain patterns in the second direction is greater than or equal to a width of a top surface of the active pattern in the second direction.

10. The semiconductor device of claim 1, wherein the channel patterns comprises four or more channel patterns, the semiconductor device further comprising at least one first gate spacer and at least one second gate spacer on a side surface of the gate electrode,
wherein the at least one first gate spacer extends from a top surface of an uppermost one of the channel patterns in the third direction, and
wherein the at least one second gate spacer is between two or more of the channel patterns and contacts at least a portion of one of the channel patterns.

11. The semiconductor device of claim 10, wherein the at least one second gate spacer overlaps the first portion of at least one of the channel patterns in the third direction.

12. The semiconductor device of claim 1, wherein the gate electrode is on the top surface of the active pattern in the first recessed portion.

13. A semiconductor device, comprising:
an active pattern on a substrate and extending in a first direction parallel to an upper surface of the substrate;
a pair of source/drain patterns on the active pattern and spaced apart from each other in the first direction;
a gate electrode that is between the pair of source/drain patterns, crosses the active pattern, and extends in a second direction parallel to the upper surface of the substrate that is different from the first direction;
a channel patterns stacked on the active pattern between the pair of source/drain patterns and configured to electrically connect the pair of source/drain patterns to each other;
a gate insulating pattern between the gate electrode and the channel patterns;
a pair of gate spacers extending from a top surface of an uppermost one of the channel patterns in a third direction perpendicular to the upper surface of the substrate to be on at least a portion of opposing side surfaces of the gate electrode;
a gate capping pattern between the pair of gate spacers and on a top surface of the gate electrode;
an interlayer insulating layer on at least one top surface of one or more of the pair of source/drain patterns and at least one side surface of one or more of the pair of gate spacers;
a pair of active contacts penetrating the interlayer insulating layer and electrically connected to the pair of source/drain patterns, respectively; and
a gate contact penetrating the gate capping pattern and electrically connected to the gate electrode,
wherein each of the channel patterns is spaced apart from another one of the channel patterns in the third direction,
wherein each of the channel patterns comprises: a first portion between the gate electrode and at least one of the pair of source/drain patterns in a plan view; and a plurality of second portions in contact with the first portion and overlapped with the gate electrode in the third direction,
wherein each of the second portions is spaced apart from another one of the second portions in the second direction,
wherein a top surface of the active pattern comprises a first recessed portion that is between the pair of source/drain patterns in the first direction, in a plan view, and
wherein the first recessed portion is between two of the second portions in the second direction, in a plan view.

14. The semiconductor device of claim 13, wherein the first portion contacts the at least one of the pair of source/drain patterns.

15. The semiconductor device of claim 13, wherein each of the second portions is spaced apart from the at least one of the pair of source/drain patterns, with the first portion interposed therebetween.

16. The semiconductor device of claim 13, wherein the first portion is overlapped with at least one of the pair of gate spacers in the third direction.

17. A semiconductor device, comprising:
a substrate comprising a first cell region and a second cell region;
first and second active patterns on the first and second cell regions of the substrate, respectively, and extending in a first direction parallel to an upper surface of the substrate;
a first pair of source/drain patterns on the first cell region and spaced apart from each other in the first direction;
a gate electrode that is between the first pair of source/drain patterns, crosses at least one of the first active pattern or the second active pattern, and extends in a second direction parallel to the upper surface of the substrate that is different from the first direction; and
a first channel patterns stacked on the first cell region between the first pair of source/drain patterns and configured to electrically connect the first pair of source/drain patterns to each other,
wherein each of the first channel patterns is spaced apart from another one of the first channel patterns in a third direction perpendicular to the upper surface of the substrate,
wherein each of the first channel patterns comprises: a first portion between the gate electrode and at least one of the first pair of source/drain patterns in a plan view; and a plurality of second portions in contact with the first portion and overlapped with the gate electrode in the third direction,
wherein each of the second portions is spaced apart from another one of the second portions in the second direction, and
wherein a length of at least one of the second portions in the second direction is less than a length of the first portion in the second direction.

18. The semiconductor device of claim 17, further comprising:
a second pair of source/drain patterns on the second cell region and spaced apart from each other in the first direction; and
a second channel patterns stacked on the second cell region between the second pair of source/drain patterns and configured to electrically connect the second pair of source/drain patterns to each other,
wherein the gate electrode extends from a region between the first pair of source/drain patterns to a region between the second pair of source/drain patterns,
wherein the second pair of source/drain patterns are spaced apart from the first pair of source/drain patterns in the second direction,
wherein each of the second channel patterns is spaced apart from another one of the second channel patterns in the third direction,
wherein each of the second channel patterns comprises: a first portion between the gate electrode and at least one of the second pair of source/drain patterns in a plan view; and a plurality of second portions in contact with the first portion and overlapped with the gate electrode in the third direction, and
wherein each of the second portions is spaced apart from another one of the second portions in the second direction.

19. The semiconductor device of claim 17, wherein a top surface of each of the first and second active patterns comprises a recessed portion, and
wherein the recessed portion of the first active pattern is between the second portions in a plan view.

20. The semiconductor device of claim 17, wherein the first portion is free of overlap with the gate electrode in the third direction.

* * * * *